(12) United States Patent
Lin et al.

(10) Patent No.: US 9,570,372 B1
(45) Date of Patent: Feb. 14, 2017

(54) THERMALLY ENHANCED SEMICONDUCTOR ASSEMBLY WITH HEAT SPREADER AND INTEGRATED DUAL BUILD-UP CIRCUITRIES AND METHOD OF MAKING THE SAME

(71) Applicant: BRIDGE SEMICONDUCTOR CORPORATION, Taipei (TW)

(72) Inventors: Charles W. C. Lin, Singapore (SG); Chia-Chung Wang, Hsinchu County (TW)

(73) Assignee: BRIDGE SEMICONDUCTOR CORPORATION, Taipei (TW)

( * ) Notice: Subject to any disclaimer, the term of this patent is extended or adjusted under 35 U.S.C. 154(b) by 0 days.

(21) Appl. No.: 15/079,548

(22) Filed: Mar. 24, 2016

(51) Int. Cl.
  *H01L 23/367* (2006.01)
  *H01L 23/498* (2006.01)
  *H01L 21/48* (2006.01)
  *H01L 21/78* (2006.01)
  *H01L 23/544* (2006.01)

(52) U.S. Cl.
  CPC ......... *H01L 23/3672* (2013.01); *H01L 21/486* (2013.01); *H01L 21/4853* (2013.01); *H01L 21/4857* (2013.01); *H01L 21/4882* (2013.01); *H01L 21/78* (2013.01); *H01L 23/49811* (2013.01); *H01L 23/49822* (2013.01); *H01L 23/49827* (2013.01); *H01L 23/544* (2013.01); *H01L 2223/54426* (2013.01)

(58) Field of Classification Search
  CPC ............. H01L 23/3672; H01L 21/4853; H01L 21/4857;H01L 21/486; H01L 21/4882; H01L 21/78; H01L 23/49811; H01L 23/49822; H01L 23/49827; H01L 23/544
  See application file for complete search history.

(56) References Cited

U.S. PATENT DOCUMENTS

| | | | |
|---|---|---|---|
| 6,559,536 B1 * | 5/2003 | Katoh | H01L 23/3128 257/675 |
| 7,935,893 B2 | 5/2011 | Tanaka et al. | |
| 8,453,323 B2 | 6/2013 | Sakamoto et al. | |
| 8,501,544 B2 | 8/2013 | Pagaila | |
| 8,679,963 B2 | 3/2014 | Gulpen et al. | |
| 8,735,222 B2 | 5/2014 | Goto et al. | |
| 8,742,589 B2 | 6/2014 | Kawabata et al. | |
| 2002/0050407 A1 * | 5/2002 | Sohn | H01L 23/3128 174/262 |

(Continued)

*Primary Examiner* — Karen Kusumakar
(74) *Attorney, Agent, or Firm* — Pai Patent & Trademark Law Firm; Chao-Chang David Pai

(57) ABSTRACT

The present invention relates to methods of making a semiconductor assembly having a semiconductor device embedded in a heat spreader and electrically connected to a dual-stage formed interconnect substrate. In a preferred embodiment, the interconnect substrate consists of first and second build-up circuitries and the methods are characterized by the step of attaching a semiconductor subassembly having a first build-up circuitry adhered to a sacrificial carrier to a heat spreader using an adhesive with the semiconductor device inserted into a cavity of the heat spreader and the step of detaching the sacrificial carrier from the first build-up circuitry. The heat spreader provides thermal dissipation, and the first and second build-up circuitries provide staged fan-out routing for the semiconductor device.

11 Claims, 21 Drawing Sheets

(56) References Cited

U.S. PATENT DOCUMENTS

| | | | |
|---|---|---|---|
| 2004/0164402 A1* | 8/2004 | Yoshimura | H01L 23/3737 257/706 |
| 2004/0190245 A1* | 9/2004 | Tirumala | H01L 23/3672 361/690 |
| 2005/0280141 A1* | 12/2005 | Zhang | H01L 23/3128 257/707 |

* cited by examiner

THERMALLY ENHANCED SEMICONDUCTOR ASSEMBLY WITH HEAT SPREADER AND INTEGRATED DUAL BUILD-UP CIRCUITRIES AND METHOD OF MAKING THE SAME

FIELD OF THE INVENTION

The present invention relates to a thermally enhanced semiconductor assembly, more particularly, to a thermally enhanced semiconductor assembly having a semiconductor device embedded in a heat spreader and electrically connected to dual-stage formed build-up circuitries and a method of making the same.

DESCRIPTION OF RELATED ART

The convergence of mobility, communication, and computing has created significant thermal, electrical, form-factor and reliability challenges to the semiconductor packaging industry. Despite numerous configurations for embedding semiconductor chip in wiring board or mold compound reported in the literature, many performance-related deficiencies remain. For example, the assemblies disclosed by U.S. Pat. Nos. 8,742,589, 8,735,222, 8,679,963, 8,453,323 may render performance degradation problems as the heat generated by the embedded chip can't be dissipated properly through the thermally insulating material such as laminate or mold compound.

Further, as these assemblies utilize micro-vias for electrical connection of the embedded chip, a significant drawback arising from the fabrication of the above assembly structures is that the embedded chip may dislocate during encapsulation or lamination process. Incomplete metallization of micro-via on the chip I/O pad due to chip dislocation as described in U.S. Pat. Nos. 8,501,544, 7,935,893 further degrades the quality of the electrical connection, thereby lowering reliability and production yield of the fabricated assembly.

For the reasons stated above, and for other reasons stated below, a significant need exists to develop a new apparatus and method to interconnect embedded chip without using micro-vias at I/O pads to improve chip-level reliability and refrain from the use of mold compound or laminate to prevent overheating of chip that creates enormous concerns in device electrical performance.

SUMMARY OF THE INVENTION

A primary objective of the present invention is to provide a semiconductor assembly in which a semiconductor device is electrically coupled to an interconnect substrate through a plurality of bumps so as to resolve alignment problems between the semiconductor device and the interconnect substrate and avoid laser or photo-imaging process directly acting on device I/O pads, thereby improving production yield and reliability of the semiconductor assembly.

Another objective of the present invention is to provide a semiconductor assembly having first and second build-up circuitries integrated together as the interconnect substrate so as to enable high routing flexibility and achieve superior signal integrity. For instance, the first build-up circuitry can be configured as primary fan-out circuitry with very high routing density and the second build-up can be configured as further fan-out circuitry with much coarse line/space for next-level board assembling. The two build-up circuitries integrated together can provided staged fan-out routing and offer the shortest possible interconnection length for the assembly, thereby reducing the inductance and improving the electrical performance of the assembly.

Yet another objective of the present invention is to provide a semiconductor assembly in which the semiconductor device is enclosed in a heat spreader so as to effectively dissipate the heat generated by the semiconductor device, thereby improving signal integrity and electrical performance of the assembly.

In accordance with the foregoing and other objectives, the present invention provides a thermally enhanced semiconductor assembly that includes a semiconductor device, a heat spreader, a first build-up circuitry and a second build-up circuitry. In a preferred embodiment, the heat spreader, enclosing the semiconductor device, provides heat dissipation pathway for the semiconductor device and an anti-warping platform for the integrated dual build-up circuitries; the first build-up circuitry, separated from a detachable sacrificial carrier, provides primary fan-out routing for the semiconductor device, so that the pad size and pitch of the semiconductor device can be enlarged before proceeding the subsequent formation of the second build-up circuitry; and the second build-up circuitry, adjacent to the heat spreader and the first build-up circuitry, provides secondary fan-out routing and has a patterned array of terminal pads that matches the next level assembly.

In another aspect, the present invention provides a method of making a thermally enhanced semiconductor assembly, including the steps of: providing a heat spreader with a cavity; providing a semiconductor subassembly that includes (i) providing a semiconductor device, (ii) providing a first build-up circuitry detachably adhered over a sacrificial carrier, and (iii) electrically coupling the semiconductor device to the first build-up circuitry by a plurality of bumps; attaching the semiconductor subassembly to the heat spreader using an adhesive with the semiconductor device inserted into the cavity and the first build-up circuitry laterally extending beyond the cavity; detaching the sacrificial carrier from the first build-up circuitry; and forming a second build-up circuitry over the heat spreader and the first build-up circuitry, wherein the second build-up circuitry is electrically coupled to the first build-up circuitry through conductive vias.

Unless specifically indicated or using the term "then" between steps, or steps necessarily occurring in a certain order, the sequence of the above-mentioned steps is not limited to that set forth above and may be changed or reordered according to desired design.

The method of making a thermally enhanced semiconductor assembly according to the present invention has numerous advantages. For instance, forming the semiconductor subassembly before attaching it to the heat spreader can ensure the semiconductor device is electrically connected so that any contact pad disconnection problem inherent to micro-via process can be avoided. Inserting the semiconductor device to the cavity through the semiconductor subassembly is particularly advantageous as the shape or depth of the cavity or the amount of the adhesive that needs to bind the semiconductor device would not be a critical parameter that needs be tightly controlled. Additionally, the dual-stage formation of the interconnect substrate for the embedded semiconductor device is beneficial as the first build-up circuitry can be designed to provide primary fan-out routing whereas the second build-up circuitry provides further fan-out routing and horizontal interconnections between the upper and the lower devices.

These and other features and advantages of the present invention will be further described and more readily apparent from the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE PREFERRED EMBODIMENT

Hereafter, examples will be provided to illustrate the embodiments of the present invention. Advantages and effects of the invention will become more apparent from the following description of the present invention. It should be noted that these accompanying figures are simplified and illustrative. The quantity, shape and size of components shown in the figures may be modified according to practical conditions, and the arrangement of components may be more complex. Other various aspects also may be practiced or applied in the invention, and various modifications and variations can be made without departing from the spirit of the invention based on various concepts and applications.

Embodiment 1

FIGS. 1-26 are schematic views showing a method of making a semiconductor assembly that includes semiconductor devices 13, a heat spreader 20, a first build-up circuitry 110 and a second build-up circuitry 310 in accordance with an embodiment of the present invention.

Figure 1:
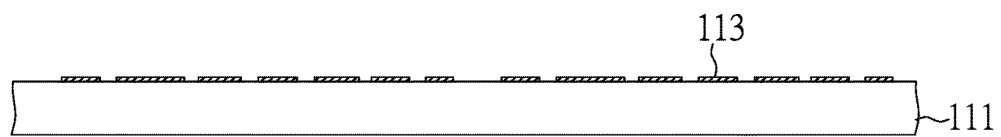
FIG. 1 is a cross-sectional view showing that first contact pads are deposited on a sacrificial carrier in accordance with the first embodiment of the present invention.

FIG. 1 is a cross-sectional view of the structure with first contact pads 113 deposited on a sacrificial carrier 111. The sacrificial carrier 111 typically can be made of any conductive or non-conductive material, such as copper, nickel, aluminum, chromium, tin, iron, stainless steel, silicon, glass, graphite, plastic film, or other metals, alloys or non-metallic materials. The thickness of the sacrificial carrier 111 preferably ranges from 0.1 to 10 mm. In this embodiment, the sacrificial carrier 111 is made of an iron-based material and has a thickness of 1.0 mm. The first contact pads 113 typically are made of copper and can be pattern deposited by numerous techniques, such as electroplating, electroless plating, evaporating, sputtering or their combinations, or be thin-film deposited followed by a metal patterning process. For a conductive sacrificial carrier 111, the first contact pads 113 are deposited typically by plating of metal. The metal patterning techniques include wet etching, electro-chemical etching, laser-assist etching, and their combinations with an etch mask (not shown) thereon that defines the first contact pads 113.

Figure 2:
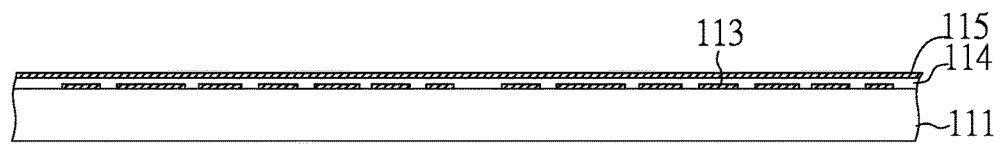
FIG. 2 is a cross-sectional view showing that a first insulating layer and a first metal sheet are disposed on the structure of FIG. 1 in accordance with the first embodiment of the present invention.

FIG. 2 is a cross-sectional view of the structure with a first insulating layer 114 and a first metal sheet 115 laminated/coated on the sacrificial carrier 111 as well as the first contact pads 113. The first insulating layer 114 contacts and covers and extends laterally on the sacrificial carrier 111 and the first contact pads 113 in the upward direction. The first metal sheet 115 contacts and covers the first insulating layer 114 from above. In this embodiment, the first insulating layer 114 typically has a thickness of 50 microns, and can be made of epoxy resin, glass-epoxy, polyimide, or the like. The first metal sheet 115 typically is a copper layer with a thickness of 25 microns.

Figure 3:
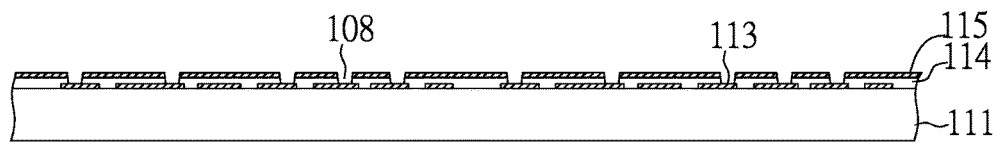
FIG. 3 is a cross-sectional view showing that the structure of FIG. 2 is provided with first via openings in accordance with the first embodiment of the present invention.

FIG. 3 is a cross-sectional view of the structure provided with first via openings 108. The first via openings 108 extend through the first metal sheet 115 and the first insulating layer 114 and are aligned with the first contact pads 113. The first via openings 108 may be formed by numerous techniques, such as laser drilling, plasma etching and photolithography, and typically have a diameter of 50 microns. Laser drilling can be enhanced by a pulsed laser. Alternatively, a scanning laser beam with a metal mask can be used. For instance, copper can be etched first to create a metal window followed by laser.

Figure 4:
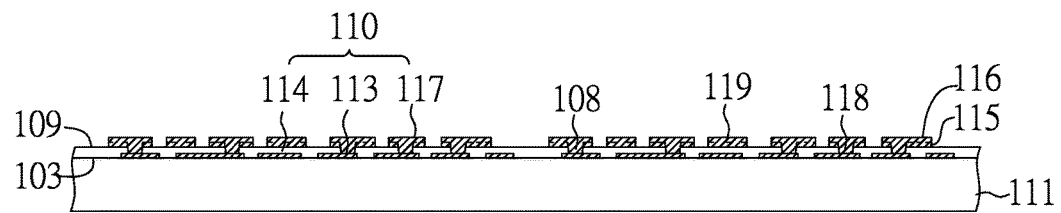
FIGS. 4 and 5 are cross-sectional and top perspective views, respectively, showing that the structure of FIG. 3 is provided with first conductive traces in accordance with the first embodiment of the present invention.
Figure 5:
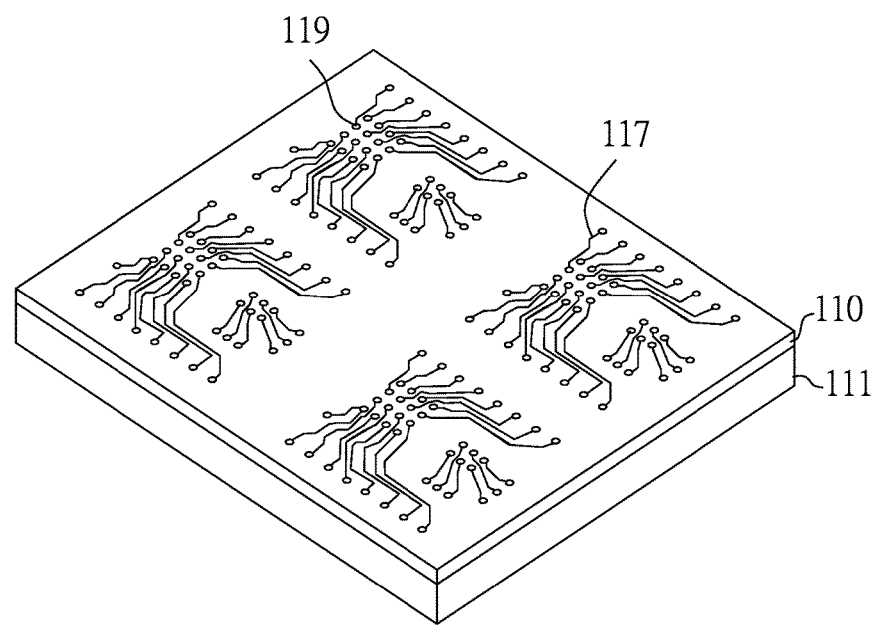

FIGS. 4 and 5 are cross-sectional and top perspective views, respectively, of the structure provided with first conductive traces 117. The first conducive traces 117 are formed on the first insulating layer 114 by depositing a first plated layer 116 on the first metal sheet 115 and into the first via openings 108 and then patterning the first metal sheet 115 as well as the first plated layer 116 thereon. Alternatively, when no first metal sheet 115 is laminated on the first insulating layer 114 in the previous process, the first insulating layer 114 can be directly metallized to form the first conductive traces 117. The first conductive traces 117 extend from the first contact pads 113 in the upward direction, fill up the first via openings 108 to form first conductive vias 118 in direct contact with the first contact pads 113, and extend laterally on the first insulating layer 114. As a result, the first conductive traces 117 can provide horizontal signal routing in both the X and Y directions and vertical routing through the first via openings 108 and serve as electrical connections for the first contact pads 113. As shown in FIG. 5, the first conductive traces 117 include a patterned array of second contact pads 119.

The first plated layer 116 can be deposited as a single layer or multiple layers by any of numerous techniques, such as electroplating, electroless plating, evaporating, sputtering, or their combinations. For instance, it can be deposited by first dipping the structure in an activator solution to render the first insulating layer 114 catalytic to electroless copper, and then a thin copper layer is electrolessly plated to serve as the seeding layer before a second copper layer is electroplated on the seeding layer to a desirable thickness. Alternatively, the seeding layer can be formed by sputtering a thin film such as titanium/copper before depositing the electroplated copper layer on the seeding layer. Once the desired thickness is achieved, the plated layer can be patterned to form the first conductive traces 117 by any of numerous techniques, such as wet etching, electro-chemical etching, laser-assist etching, or their combinations, with an etch masks (not shown) thereon that define the first conductive traces 117.

The first metal sheet 115 and the first plated layer 116 are shown as a single layer for convenience of illustration. The boundary (shown in broken lines) between the metal layers may be difficult or impossible to detect since copper is plated on copper.

At this stage, the formation of a first build-up circuitry 110 on the sacrificial carrier 111 is accomplished. In this illustration, the first build-up circuitry 110 includes first contact pads 113, a first insulating layer 114 and first conductive traces 117. The first conductive traces 117 include second contact pads 119 that are electrically connected to the first contact pads 113 by first conductive vias 118 and can serve as electrical contacts for the subsequent device attachment. In this embodiment, the first contact pads 113 have larger pad pitch and size than that of the second contact pads 119. As a result, the first build-up circuitry 110 contains a pattern of traces that fan out from the second contact pads 119 at its second surface 109 to the first contact pads 113 at its first surface 103.

Figure 6:
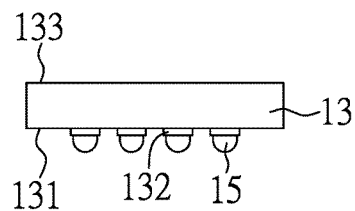
FIG. 6 is a cross-sectional view of a semiconductor device with bumps mounted thereon in accordance with the first embodiment of the present invention.

FIG. 6 is a cross-sectional view of a semiconductor device 13 with bumps 15 mounted thereon. The semiconductor device 13, illustrated as a bare chip, includes an active surface 131, an inactive surface 133 opposite to the active surface 131, and I/O pads 132 on the active surface 131. The bumps 15 are mounted on the I/O pads 132 of the semiconductor device 13 and may be solder, gold or copper pillars.

Figure 7:
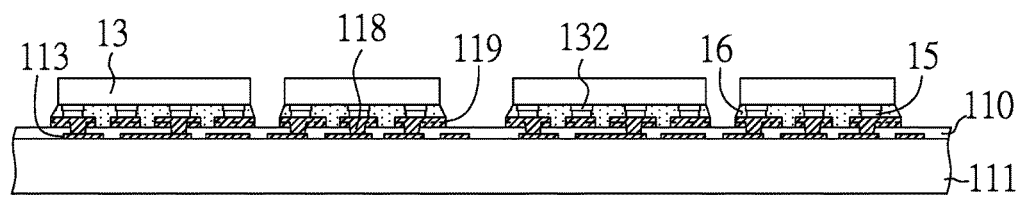
FIGS. 7 and 8 are cross-sectional and top perspective views, respectively, showing that the semiconductor devices of FIG. 6 are electrically coupled to the structure of FIGS. 4 and 5 in accordance with the first embodiment of the present invention.
Figure 8:
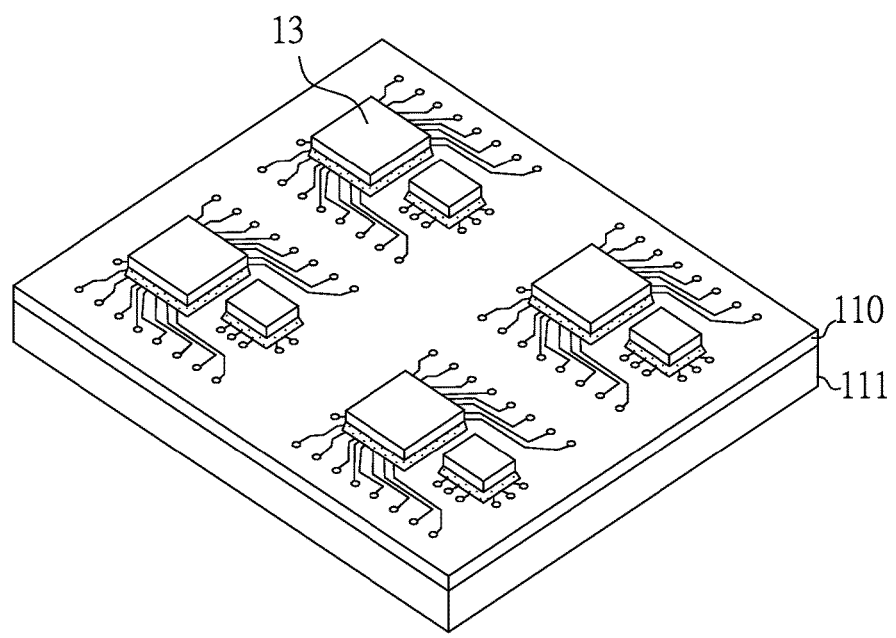

FIGS. 7 and 8 are cross-sectional and top perspective views, respectively, of the panel-scale structure with the semiconductor devices electrically coupled to the first build-up circuitry 110. The semiconductor devices 13 can be electrically coupled to the second contact pads 119 of the first build-up circuitry 110 using the bumps 15 by thermal compression, solder reflow or thermosonic bonding. As an alternative, the bumps 15 may be first deposited on the second contact pads 119 of the first build-up circuitry 110, and then the semiconductor devices 13 are electrically coupled to the first build-up circuitry 110 by the bumps 15. Optionally, underfill 16 can be further provided to fill the gap between the first build-up circuitry 110 and the semiconductor devices 13 to enhance the bonding strength between the semiconductor devices 13 and the first build-up circuitry 110.

Figure 9:
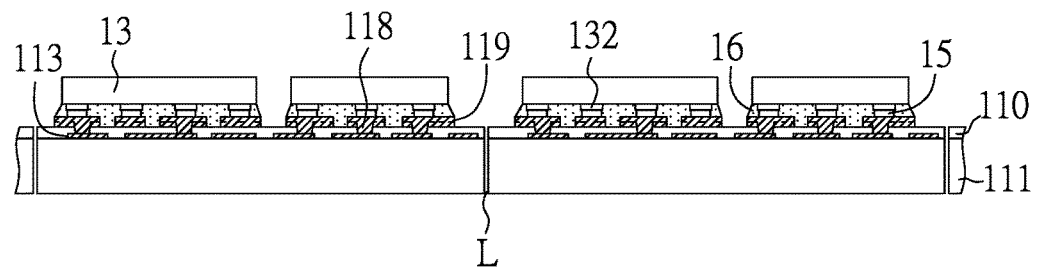
FIGS. 9 and 10 are cross-sectional and top perspective views, respectively, of a diced state of the panel-scale structure of FIGS. 7 and 8 in accordance with the first embodiment of the present invention.
Figure 10:
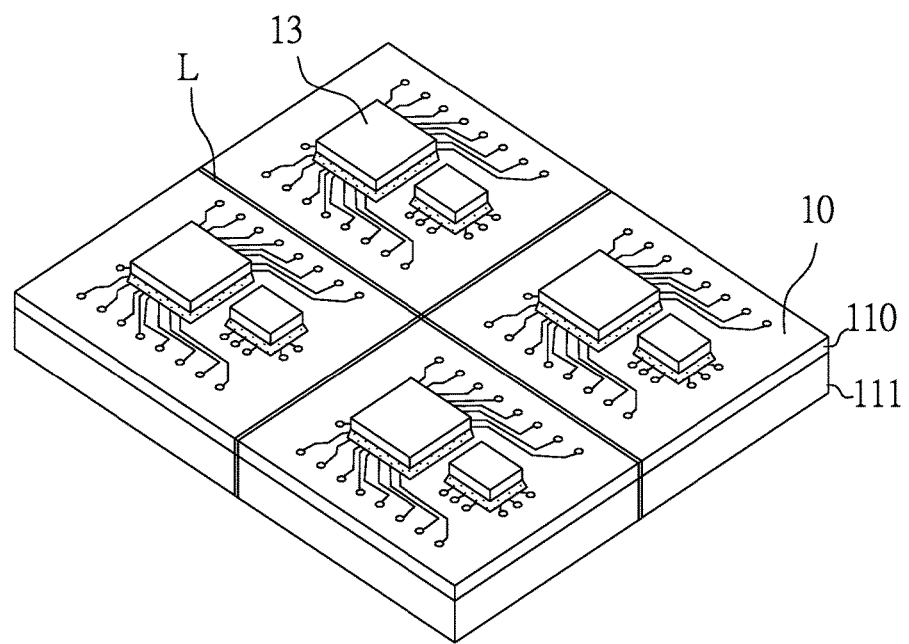

FIGS. 9 and 10 are cross-sectional and top perspective views, respectively, of the panel-scale structure diced into individual pieces. The panel-scale structure is singluated into individual semiconductor subassembly 10 along dicing lines "L".

Figure 11:
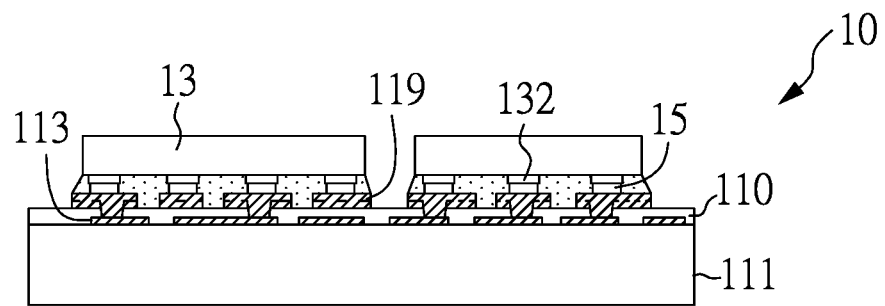
FIGS. 11 and 12 are cross-sectional and top perspective views, respectively, of a semiconductor subassembly corresponding to a diced unit in FIGS. 9 and 10 in accordance with the first embodiment of the present invention.
Figure 12:
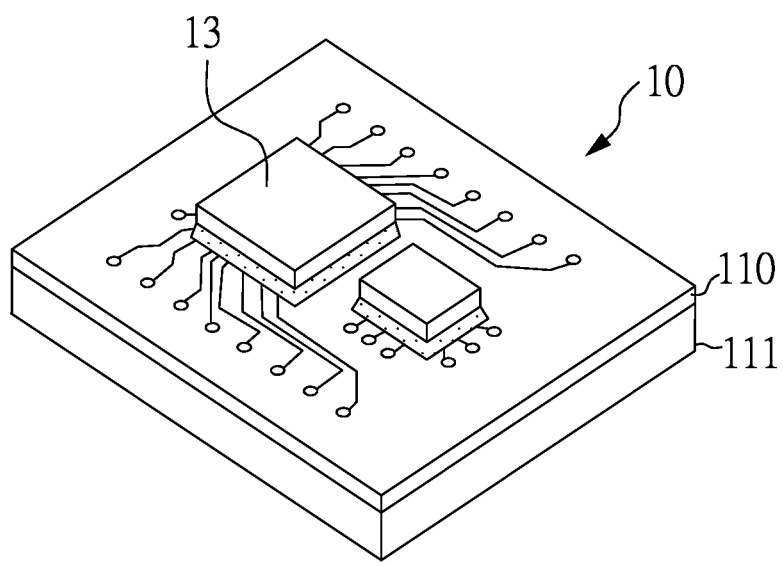

FIGS. 11 and 12 are cross-sectional and top perspective views, respectively, of the individual semiconductor subassembly 10. In this illustration, the semiconductor subassembly 10 includes two semiconductor devices 13 electrically coupled on the first build-up circuitry 110 that includes first conductive traces 117 laterally extending beyond peripheral edges of the semiconductor devices 13. As the size and pad spacing of the first contact pads 113 of the first build-up circuitry 110 are designed to be larger than those of the I/O pads 132, the first build-up circuitry 110 can provide a primary fan-out routing for the semiconductor devices 13 so as to ensure a higher manufacturing yield for the next level build-up circuitry interconnection. Furthermore, the first build-up circuitry 110 also provides primary electrical connections between adjoining semiconductor devices 13 prior to interconnecting to the next level interconnection structure.

Figure 13:
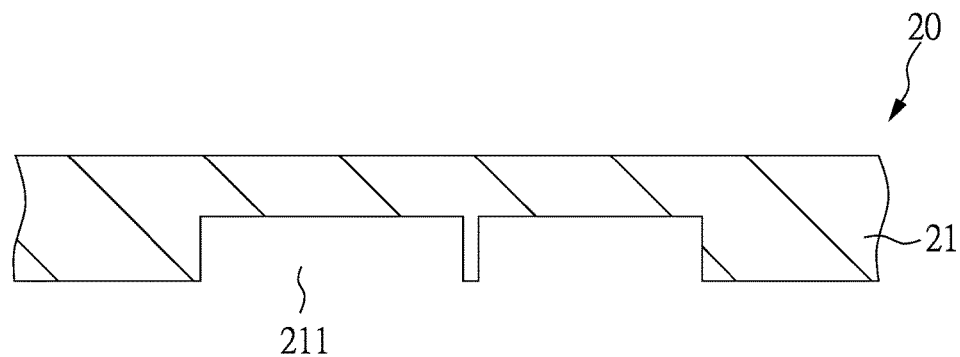
FIGS. 13 and 14 are cross-sectional and bottom perspective views, respectively, of a heat spreader in accordance with the first embodiment of the present invention.
Figure 14:
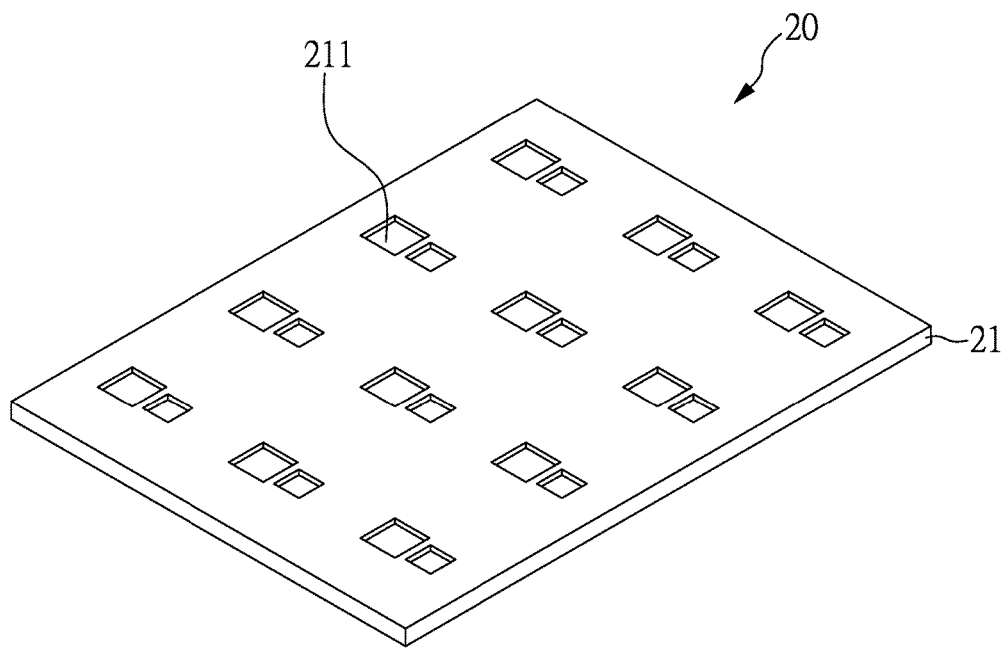

FIGS. 13 and 14 are cross-sectional and bottom perspective views, respectively, of a heat spreader 20 with cavities 211. The heat spreader 20 can be provided by forming the cavities 211 in a metal plate 21. The metal plate 21 can have a thickness of 0.1 mm to 10 mm, and typically is made of copper, aluminum, stainless steel or their alloys. In this embodiment, the metal plate 21 is a copper sheet with a thickness of 1 mm. The cavities 211 can have the same or different sizes and cavity depth. The cavity depth can range from 0.05 mm to 0.9 mm. In this illustration, the cavities 211 have a depth of 0.21 mm (to house the 0.15 mm chip with 0.05 mm conductive bump).

Figure 15:
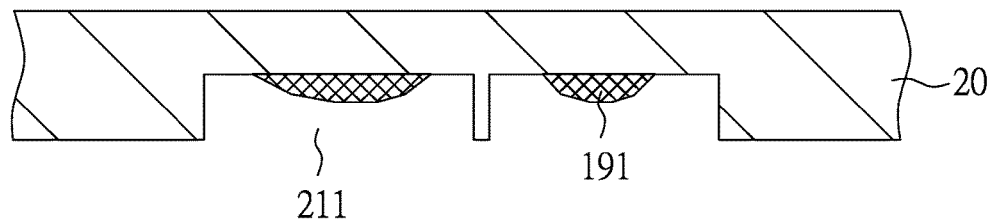
FIGS. 15 and 16 are cross-sectional and bottom perspective views, respectively, showing that a first adhesive is dispensed on the heat spreader of FIGS. 13 and 14 in accordance with the first embodiment of the present invention.
Figure 16:
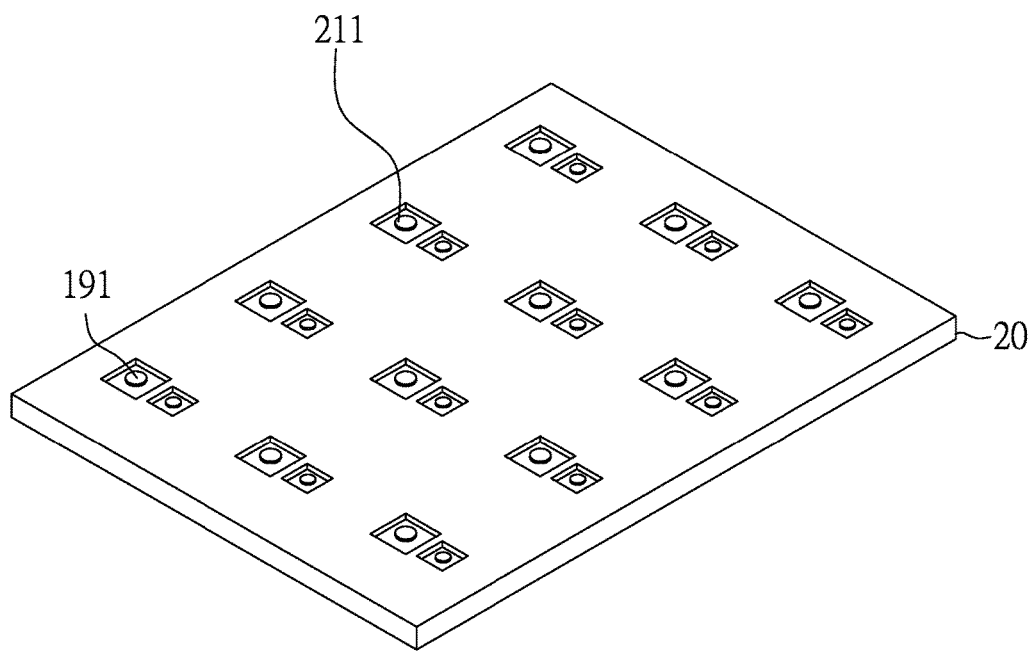

FIGS. 15 and 16 are cross-sectional and bottom perspective views, respectively, of the structure with a first adhesive 191 dispensed in the cavities 211 of the heat spreader 20. The first adhesive 191 typically is a thermally conductive adhesive and dispensed on the bottom of the cavities 211.

Figure 17:
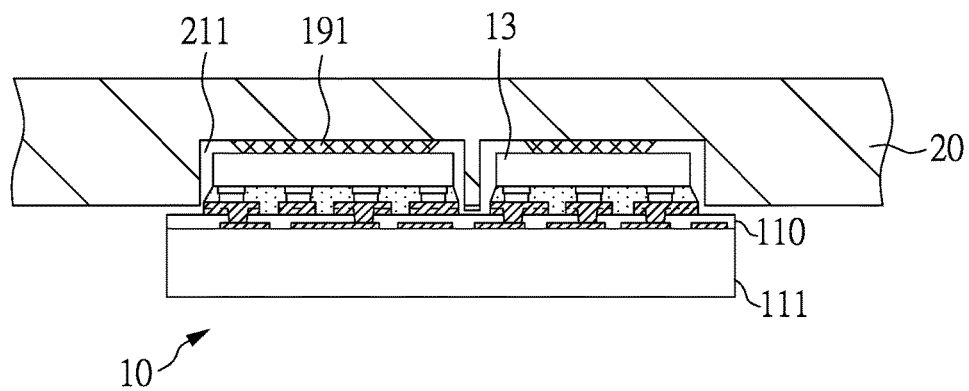
FIGS. 17 and 18 are cross-sectional and bottom perspective views, respectively, showing that the semiconductor subassemblies of FIGS. 11 and 12 are attached to the heat spreader of FIGS. 15 and 16 in accordance with the first embodiment of the present invention.
Figure 18:
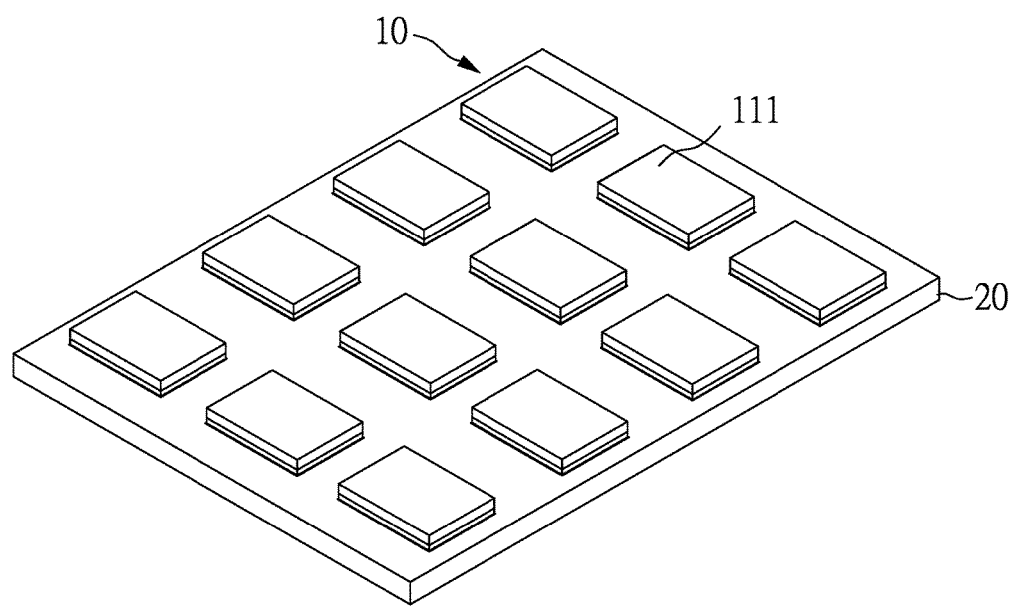

FIGS. 17 and 18 are cross-sectional and bottom perspective views, respectively, of the semiconductor subassemblies 10 attached to the heat spreader 20 using the first adhesive 191. The semiconductor devices 13 are inserted into the cavities 211, and the first build-up circuitry 110 and the sacrificial carrier 111 are located beyond the cavities 211 and spaced from the peripheral edges of the heat spreader 20.

Figure 19:
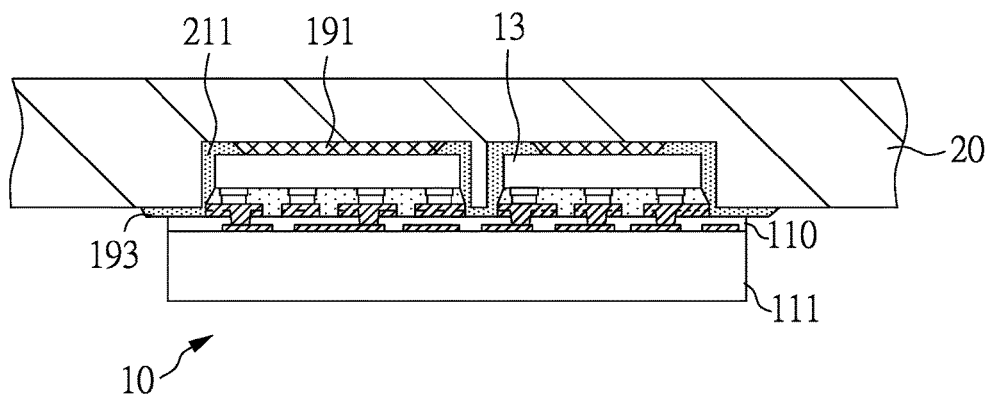
FIGS. 19 and 20 are cross-sectional and bottom perspective views, respectively, showing that the structure of FIGS. 17 and 18 is provided with a second adhesive in accordance with the first embodiment of the present invention.
Figure 20:
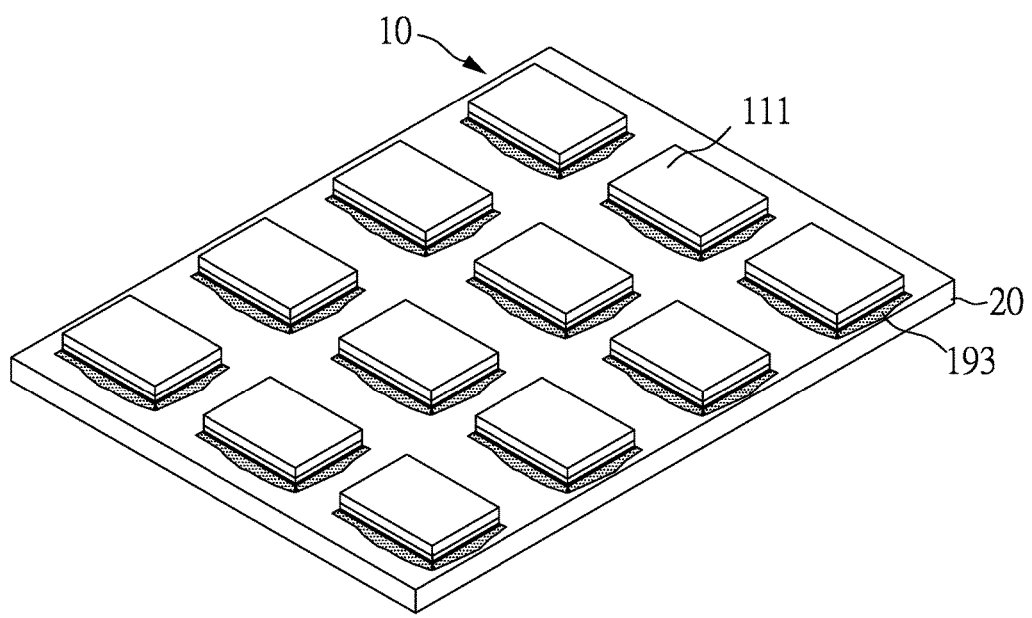

FIGS. 19 and 20 are cross-sectional and bottom perspective views, respectively, of the structure with the second adhesive 193 that fills the space between the first build-up circuitry 110 and the heat spreader 20 and further extends into the cavities 211. The second adhesive 193 typically is an electrically insulating underfill and dispensed into the space between the first build-up circuitry 110 and the heat spreader 20 and the remaining space within the cavities 211. As a result, the first adhesive 191 provides mechanical bonds and thermal connection between the semiconductor devices 13 and the heat spreader 20, and the second adhesive 193 provides mechanical bonds between the semiconductor devices 13 and the heat spreader 20 and between the first build-up circuitry 110 and the heat spreader 20.

Figure 21:
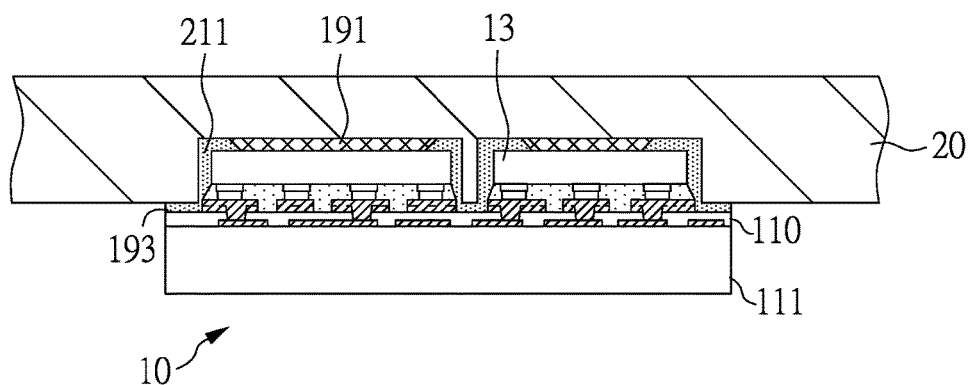
FIGS. 21 and 22 are cross-sectional and bottom perspective views, respectively, showing that the excess portion of the second adhesive is removed from the structure of FIGS. 19 and 20 in accordance with the first embodiment of the present invention.
Figure 22:
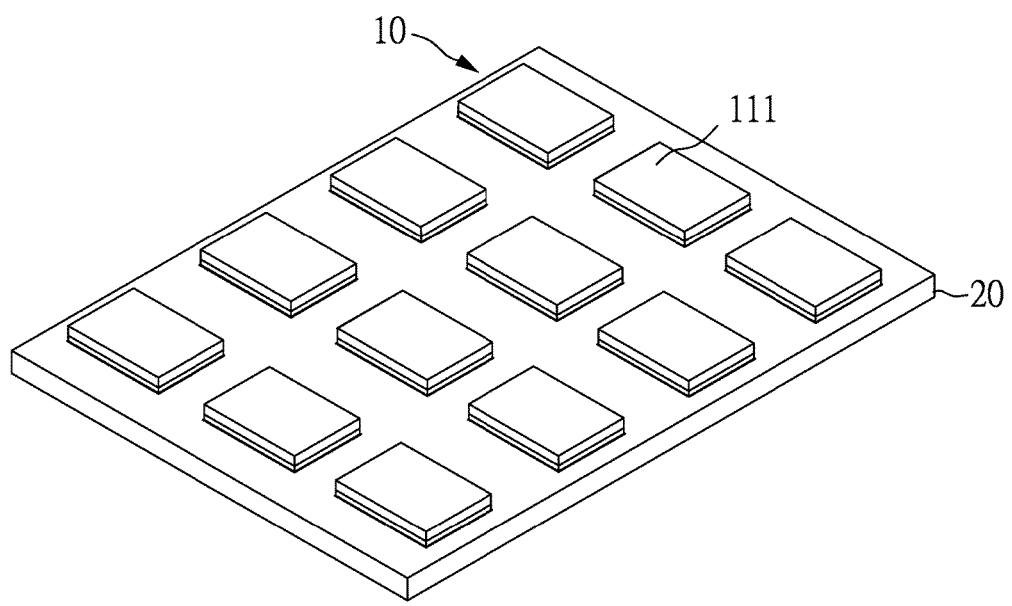

FIGS. 21 and 22 are cross-sectional and bottom perspective views, respectively, of the structure after removal of excess adhesive that flows out of the space between the first build-up circuitry 110 and the heat spreader 20. As an alternative, the step of removing excess adhesive may be omitted, and the excess adhesive becomes a portion of the subsequent build-up circuitry.

Figure 23:
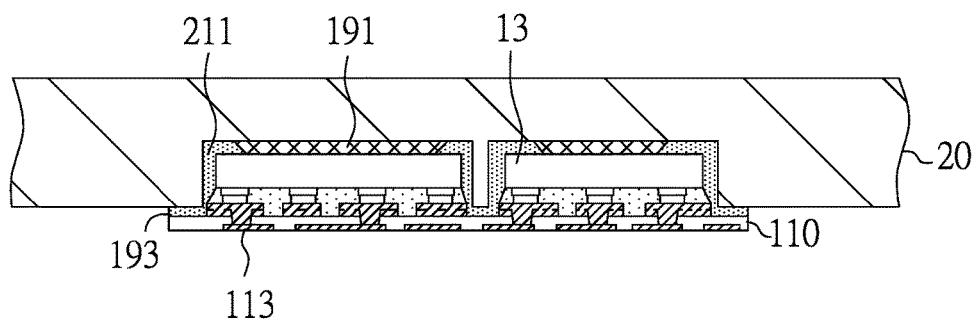
FIG. 23 is a cross-sectional view showing that the sacrificial carrier is removed from the structure of FIG. 21 in accordance with the first embodiment of the present invention.

FIG. 23 is a cross-sectional view of the structure after removal of the sacrificial carrier 111. The sacrificial carrier 111 can be removed by numerous techniques, such as wet chemical etching using acidic solution (e.g., ferric chloride, copper sulfate solutions) or alkaline solution (e.g., ammonia solution), electro-chemical etching, or mechanical process such as a drill or end mill followed by chemical etching. In this embodiment, the sacrificial carrier 111 made of an iron-based material is removed by a chemical etching solution that is selective between copper and iron so as to prevent the first contact pads 113 and the heat spreader 20 made of copper from being etched during removal of the sacrificial carrier 111.

Figure 24:
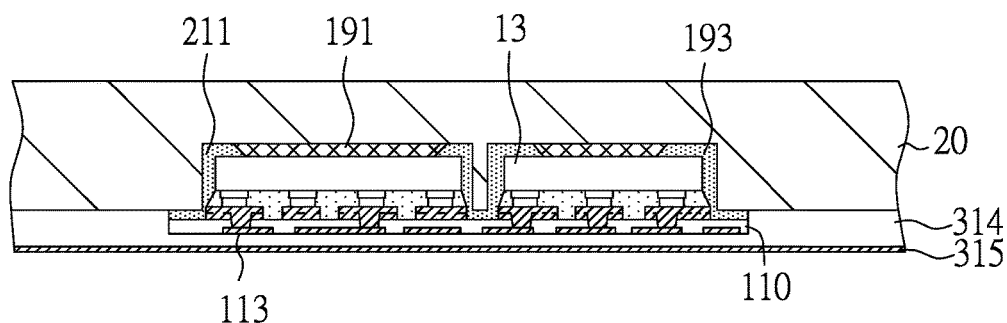
FIG. 24 is a cross-sectional view showing that a second insulating layer and a second metal sheet are disposed on the structure of FIG. 23 in accordance with the first embodiment of the present invention.

FIG. 24 is a cross-sectional view of the structure with a second insulating layer 314 and a second metal sheet 315 laminated/coated on the first build-up circuitry 110 and the heat spreader 20 in the downward direction. The second insulating layer 314 contacts and extends from the first build-up circuitry 110 and the heat spreader 20 in the downward direction and laterally covers and surrounds and conformally coats the sidewalls of the first build-up circuitry 110 and extends laterally to the peripheral edges of the structure. The second insulating layer 314 can be made of epoxy resin, glass-epoxy, polyimide, or the like. The second metal sheet 315 contacts and covers the second insulating layer 314 from below and typically is a copper layer with a thickness of 25 microns.

Figure 25:
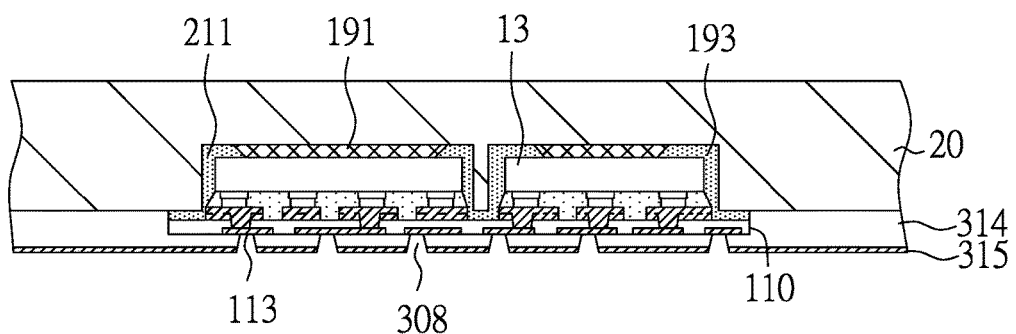
FIG. 25 is a cross-sectional view showing that the structure of FIG. 24 is provided with second via openings in accordance with the first embodiment of the present invention.

FIG. 25 is a cross-sectional view of the structure provided with the second via openings 308 to expose selected portions of the first contact pads 113 of the first build-up circuitry 110. The second via openings 308 extend through the second metal sheet 315 and the second insulating layer 314, and are aligned with selected portions of the first contact pads 113. Like the first via openings 108, the second via openings 308 can be formed by any of numerous techniques, such as laser drilling, plasma etching and photolithography and typically have a diameter of 50 microns.

Figure 26:
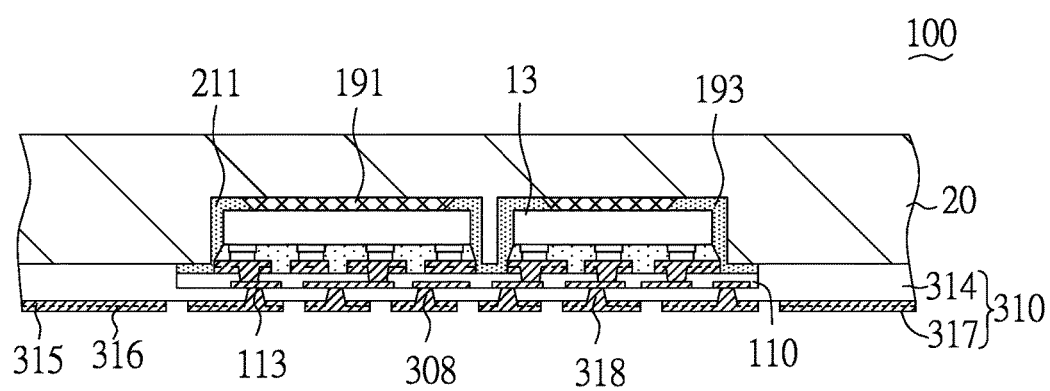
FIG. 26 is a cross-sectional view showing that the structure of FIG. 25 is provided with second conductive traces to finish the fabrication of a semiconductor assembly in accordance with the first embodiment of the present invention.

Referring now to FIG. 26, second conductive traces 317 are formed on the second insulating layer 314 by depositing a second plated layer 316 on the second metal sheet 315 and into the second via openings 308 and then patterning the second metal sheet 315 as well as the second plated layers 316 thereon. Alternatively, when no second metal sheet 315 is laminated on the second insulating layer 314 in the previous process, the second insulating layer 314 can be directly metallized to form the second conductive traces 317. The second conductive traces 317 extend from the first contact pads 113 in the downward direction, fill up the second via openings 308 to form second conductive vias 318 in direct contact with the first contact pads 113 of the first build-up circuitry 110, and extend laterally on the second insulating layer 314. In this illustration, the second conductive traces 317 laterally extend beyond peripheral edges of the first build-up circuitry 110.

Accordingly, as shown in FIG. 26, a semiconductor assembly 100 is accomplished and includes semiconductor devices 13, a heat spreader 20, a first build-up circuitry 110 and a second build-up circuitry 310. In this illustration, the first build-up circuitry 110 includes first contact pads 113, a first insulating layer 114 and first conductive traces 117, whereas the second build-up circuitry 310 includes a second first layer 314 and second conductive traces 317. The semiconductor devices 13 are electrically coupled to the pre-fabricated first build-up circuitry 110 by flip chip process and enclosed in cavities 211 of the heat spreader 20 with the first build-up circuitry 110 laterally extending beyond the cavities 211. The second build-up circuitry 310 is electrically coupled to the first build-up circuitry 110 through the second conductive vias 318 in direct contact with the first contact pads 113 of the first build-up circuitry 110, and thus the electrical connection between the first build-up circuitry 110 and the second build-up circuitry 310 is devoid of soldering material.

Embodiment 2

FIGS. 27-36 are cross-sectional views showing a method of making another semiconductor assembly in which the heat spreader has a registration mark outside its cavity and is further electrically coupled to the second build-up circuitry in accordance with another embodiment of the present invention.

For purposes of brevity, any description in Embodiment 1 above is incorporated herein insofar as the same is applicable, and the same description need not be repeated.

Figure 27:
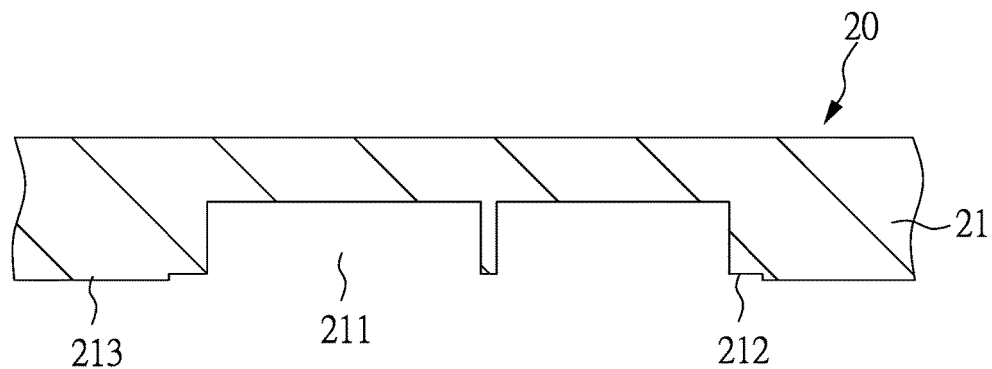
FIG. 27 is a cross-sectional view of a heat spreader in accordance with the second embodiment of the present invention.

FIG. 27 is a cross-sectional view of a heat spreader 20 with a registration mark 213 around the entrance of cavities 211. The registration mark 213 can be formed by removing selected portions of a metal plate 21 or by pattern deposition of a metal or plastic material on the metal plate 21. Plating, etching, mechanical carving or lamination is typically used to form the registration mark 213. Accordingly, the registration mark 213 projects from the flat surface 212 of the heat spreader 20 adjacent to the cavity entrance in the downward direction and can have a thickness of 5 to 200 microns. In this embodiment, the registration mark 213 with a thickness of 30 microns laterally extends to the peripheral edges of the heat spreader 20 and has inner peripheral edges that conform to the four lateral sides of a subsequently disposed first build-up circuitry.

Figure 28:
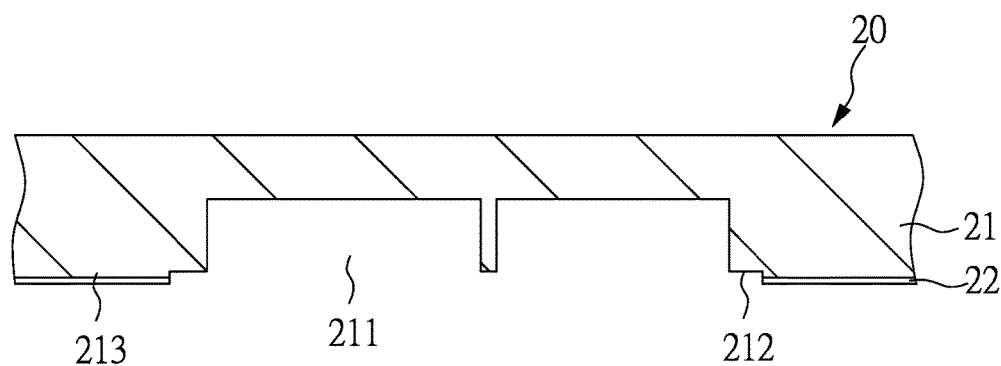
FIG. 28 is a cross-sectional view showing that a protective layer is formed on the heat spreader of FIG. 27 in accordance with the second embodiment of the present invention.

FIG. 28 is a cross-sectional view of the heat spreader 20 with a protective layer 22 deposited thereon. The heat spreader 20 made of copper typically is provided with a protective layer 22 on the registration mark 213. In this embodiment, the protective layer 22 is a nickel layer and has a thickness of 5 microns.

Figure 29:
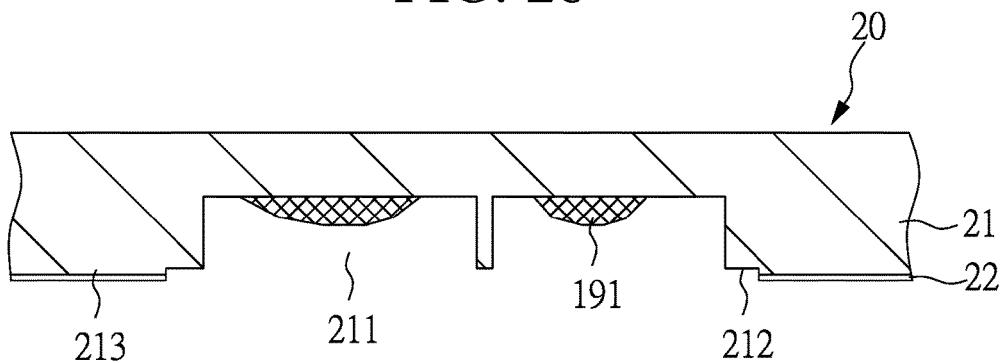
FIG. 29 is a cross-sectional view showing that a first adhesive is dispensed on the heat spreader of FIG. 28 in accordance with the second embodiment of the present invention.

FIG. 29 is a cross-sectional view of the heat spreader 20 with a first adhesive 191 dispensed in the cavities 211. The first adhesive 191 typically is a thermally conductive adhesive and dispensed on the cavity bottoms.

Figure 30:
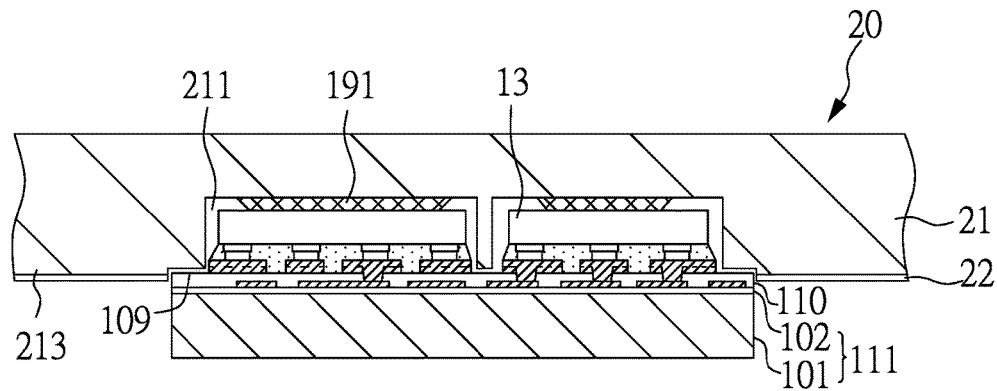
FIG. 30 is a cross-sectional view showing that a semiconductor subassembly is attached to the heat spreader of FIG. 29 in accordance with the second embodiment of the present invention.

FIG. 30 is a cross-sectional view of the structure with a semiconductor subassembly 10 attached to the heat spreader 20 using the first adhesive 191. The semiconductor subassembly 10 is similar to that illustrated in FIG. 11, except that the sacrificial carrier 111 includes a support sheet 101 and a barrier layer 102 deposited on the support sheet 101, and the first build-up circuitry 110 is formed on the barrier layer 102 in this embodiment. The barrier layer 102 can have a thickness of 0.001 to 0.1 mm and may be a metal layer that is inactive against chemical etching during chemical removal of the support sheet 101 and can be removed without affecting the first contact pads 113. For instance, the barrier layer 102 may be made of till or nickel when the support sheet 101 and the first contact pads 113 are made of copper. Further, in addition to metal materials, the barrier layer 102 can also be a dielectric layer such as a peelable laminate film. In this embodiment, the support sheet 101 is a copper sheet, and the barrier layer 102 is a nickel layer of 5 microns in thickness. In this illustration, the semiconductor subassembly 10 is attached to the heat spreader 20 with the semiconductor devices 13 inserted into the cavities 211 and the registration mark 213 laterally aligned with and in close proximity to the peripheral edges of the first build-up circuitry 110. The subassembly placement accuracy is provided by the registration mark 213. The registration mark 213 extends beyond the second surface 109 of the first build-up circuitry 110 in the downward direction and is located beyond and laterally aligned with the four lateral surfaces of the first build-up circuitry 110 in the lateral directions. Because the registration mark 213 is in close proximity to and conforms to the four lateral surfaces of the first build-up circuitry 110 in lateral directions, any undesirable movement of the semiconductor subassembly 10 due to adhesive curing can be avoided. Preferably, a gap in between the first build-up circuitry 110 and the registration mark 213 is in a range of about 5 to 50 microns. The semiconductor subassembly 10 can also be attached without the registration mark 213. Although the cavities 211 cannot provide placement accuracy for the semiconductor subassembly 10 due to control difficulties in the cavity size and depth, it does not result in micro-via connection failure in the subsequent process of forming a second build-up circuitry on the first build-up circuitry 110 after removing the sacrificial carrier 111 due to the larger pad size and pitch of the first contact pads 113 of the first build-up circuitry 110.

Figure 31:
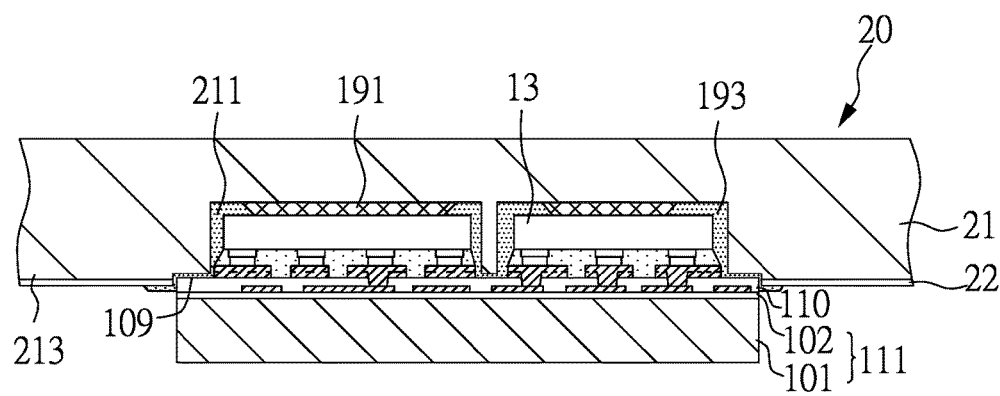
FIG. 31 is a cross-sectional view showing that the structure of FIG. 30 is provided with a second adhesive in accordance with the second embodiment of the present invention.

FIG. 31 is a cross-sectional view of the structure with a second adhesive 193 that fills the space between the first build-up circuitry 110 and the heat spreader 20 and further extends into the cavities 211. The second adhesive 193 typically is an electrically insulating underfill and dispensed into the space between the first build-up circuitry 110 and the heat spreader 20 and the remaining space within the cavities 211.

Figure 32:
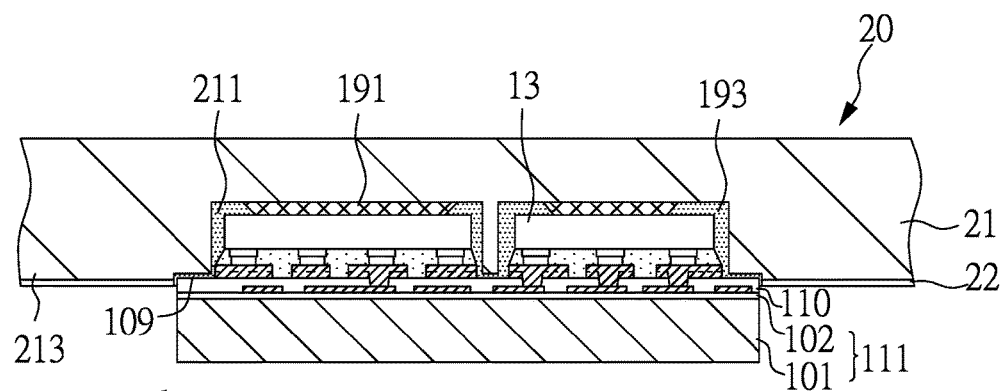
FIG. 32 is a cross-sectional view showing that the excess portion of the second adhesive is removed from the structure of FIG. 31 in accordance with the second embodiment of the present invention.
Figure 33:
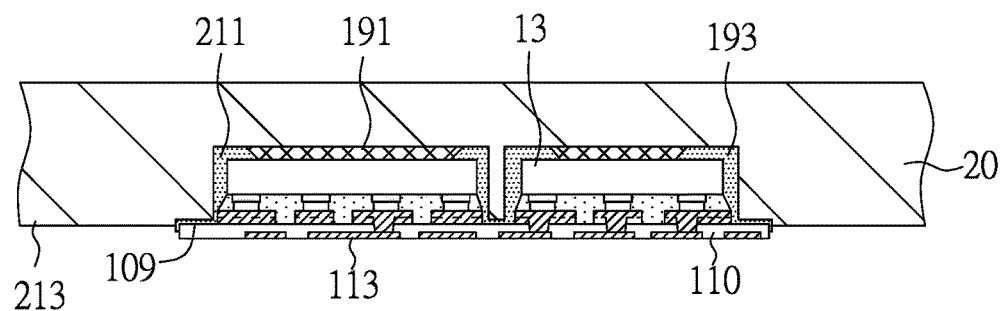
FIG. 33 is a cross-sectional view showing that the sacrificial carrier and the protective layer are removed from the structure of FIG. 32 in accordance with the second embodiment of the present invention.

FIG. 32 is a cross-sectional view of the structure after removal of excess adhesive that overflows onto the protective layer 22. As an alternative, the step of removing excess adhesive may be omitted, and the excess adhesive becomes a portion of the subsequent build-up circuitry. FIG. 33 is a cross-sectional view of the structure after removal of the sacrificial carrier 111 and the protective layer 22. The support sheet 101 made of copper is removed by an alkaline etching solution. Subsequently, the barrier layer 102 and the protective layer 22 made of nickel are removed by an acidic etching solution to expose the first contact pads 113 of the first build-up circuitry 110 from below. In another aspect, the barrier layer 102 and the protective layer 22 each being a peelable laminate film, the barrier layer 102 and the protective layer 22 can be removed by mechanical peeling or plasma ashing.

Figure 34:
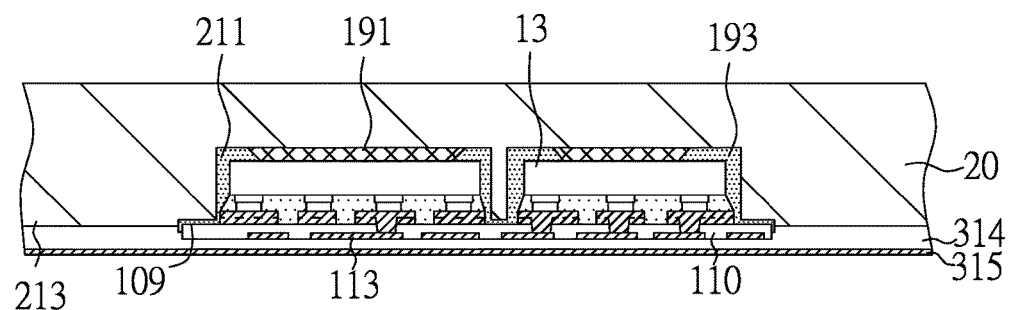
FIG. 34 is a cross-sectional view showing that a second insulating layer and a second metal sheet are disposed on the structure of FIG. 33 in accordance with the second embodiment of the present invention.

FIG. 34 is a cross-sectional view of the structure with a second insulating layer 314 and a second metal sheet 315 laminated/coated on the first build-up circuitry 110 and the heat spreader 20. The second insulating layer 314 contacts and provides robust mechanical bonds between the second metal sheet 315 and the first build-up circuitry 110 and between the second metal sheet 315 and the heat spreader 20.

Figure 35:
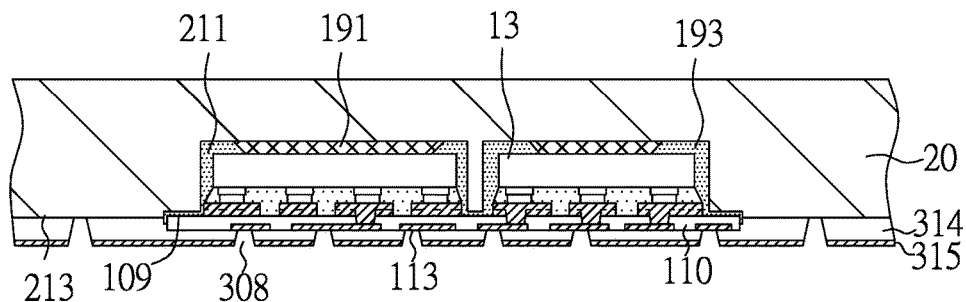
FIG. 35 is a cross-sectional view showing that the structure of FIG. 34 is provided with second via openings in accordance with the second embodiment of the present invention.

FIG. 35 is a cross-sectional view of the structure provided with second via openings 308. The second via openings 308 extend through the second metal sheet 315 and the second insulating layer 314 and are aligned with the first contact pads 113 of the first build-up circuitry 110 and the registration mark 213 of the heat spreader 20.

Figure 36:
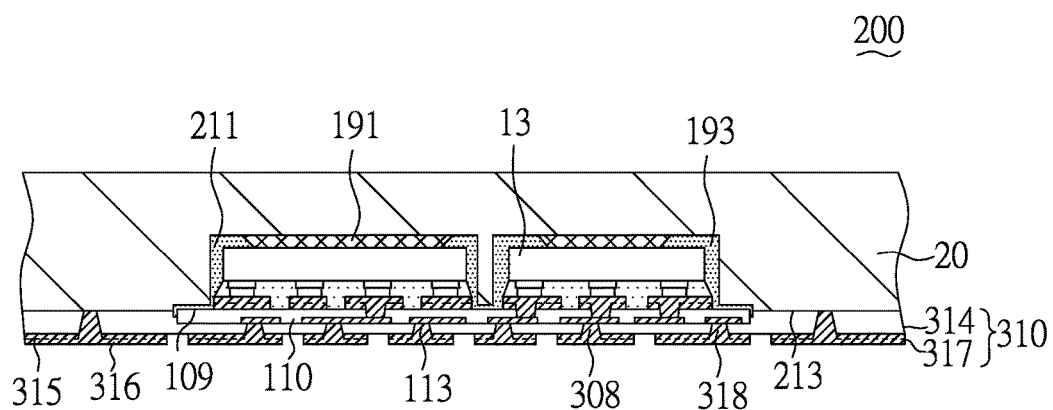
FIG. 36 is a cross-sectional view showing that the structure of FIG. 35 is provided with second conductive traces to finish the fabrication of a semiconductor assembly in accordance with the second embodiment of the present invention.

Referring now to FIG. 36, second conductive traces 317 are formed on the second insulating layer 314 by depositing a second plated layer 316 on the second metal sheet 315 and into the second via openings 308 and then patterning the second metal sheet 315 as well as the second plated layer 316 thereon. The second conductive traces 317 extend from the first contact pads 113 and the registration mark 213 in the downward direction, fill up the second via openings 308 to form second conductive vias 318 in direct contact with the first contact pads 113 of the first build-up circuitry 110 and the registration mark 213 of the heat spreader 20, and extend laterally on the second insulating layer 314.

Accordingly, as shown in FIG. 36, a semiconductor assembly 200 is accomplished and includes semiconductor devices 13, a heat spreader 20, a first build-up circuitry 110 and a second build-up circuitry 310. The semiconductor devices 13 are electrically coupled to the pre-fabricated first build-up circuitry 110 by flip chip process and enclosed in cavities 211 of the heat spreader 20 with the first build-up circuitry 110 laterally extending beyond the cavities 211. The registration mark 213 of the heat spreader 20 extends beyond the second surface 109 of the first build-up circuitry 110 in the downward direction and is in close proximity to the peripheral edges of the first build-up circuitry 110 to provide critical placement accuracy for the first build-up circuitry 110. The second build-up circuitry 310 is electrically coupled to the first build-up circuitry 110 and the heat spreader 20 through the second conductive vias 318 to provide signal routings for the first build-up circuitry 110 and ground connection for the heat spreader 20.

Embodiment 3

FIGS. 37-46 are cross-sectional views showing a method of making yet another semiconductor assembly which uses a laminate substrate as the heat spreader in accordance with yet another embodiment of the present invention.

For purposes of brevity, any description in aforementioned Embodiments above is incorporated herein insofar as the same is applicable, and the same description need not be repeated.

Figure 37:
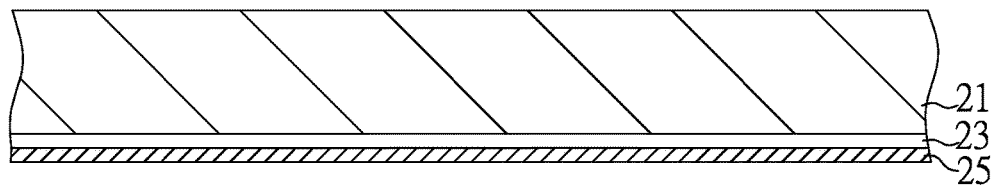
FIG. 37 is a cross-sectional view of a laminate substrate in accordance with the third embodiment of the present invention.
Figure 38:
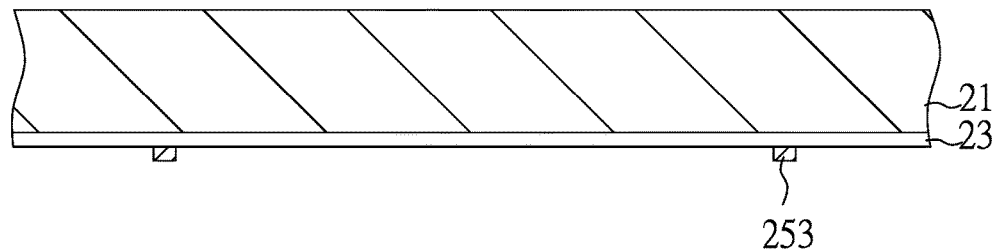
FIG. 38 is a cross-sectional view showing that the laminate substrate of FIG. 37 is processed to form a registration mark in accordance with the third embodiment of the present invention.

FIGS. 37 and 38 are cross-sectional views showing a process of forming a registration mark on a dielectric layer of a laminate substrate in accordance with an embodiment of the present invention.

FIG. 37 is a cross-sectional view of a laminate substrate that includes a metal plate 21, a dielectric layer 23 and a metal layer 25. The dielectric layer 23 is sandwiched between the metal plate 21 and the metal layer 25. The dielectric layer 23 typically is made of epoxy resin, glass-epoxy, polyimide, or the like, and has a thickness of 50 microns. The metal layer 25 typically is made of copper, but copper alloys or other materials (such as aluminum, stainless steel or their alloys) may also be used. The thickness of the metal layer 25 can range from 5 to 200 microns. In this embodiment, the metal layer 25 is a copper plate with a thickness of 50 microns.

FIG. 38 is a cross-sectional view of the structure with a registration mark 253 formed on the dielectric layer 23. The registration mark 253 can be formed by removing selected portions of the metal layer 25 using photolithography and wet etching. In this illustration, the registration mark 253 consists of plural metal posts. However, the registration mark patterns are not limited thereto and can be other various patterns against undesirable movement of the subsequently disposed subassembly. For instance, the registration mark 253 may consist of a continuous or discontinuous strip and conform to four sides, two diagonal corners or four corners of a subsequently disposed semiconductor subassembly.

Figure 39:
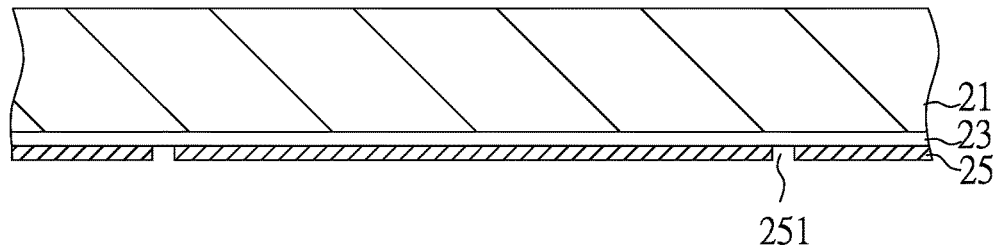
FIG. 39 is a cross-sectional view of a laminate substrate with openings in accordance with the third embodiment of the present invention.
Figure 40:
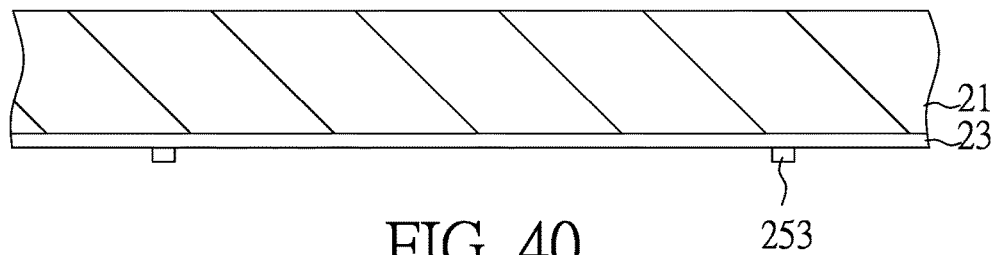
FIG. 40 is a cross-sectional view showing that the laminate substrate of FIG. 39 is processed to form a registration mark in accordance with the third embodiment of the present invention.

FIGS. 39 and 40 are cross-sectional views showing an alternative process of forming a registration mark on a dielectric layer of a laminate substrate.

FIG. 39 is a cross-sectional view of a laminate substrate with a set of openings 251. The laminate substrate includes a metal plate 21, a dielectric layer 23 and a metal layer 25 as above mentioned, and the openings 251 are formed by removing selected portions of the metal layer 25.

FIG. 40 is a cross-sectional view of the structure with the registration mark 253 formed on the dielectric layer 23. The registration mark 253 can be formed by dispensing or printing a photosensitive plastic material (e.g., epoxy, polyimide, etc.) or non-photosensitive material into the openings 251, followed by removing the entire metal layer 25. Herein, the registration mark 253 consists of plural resin posts and has a pattern against undesirable movement of a subsequently disposed subassembly.

Figure 41:
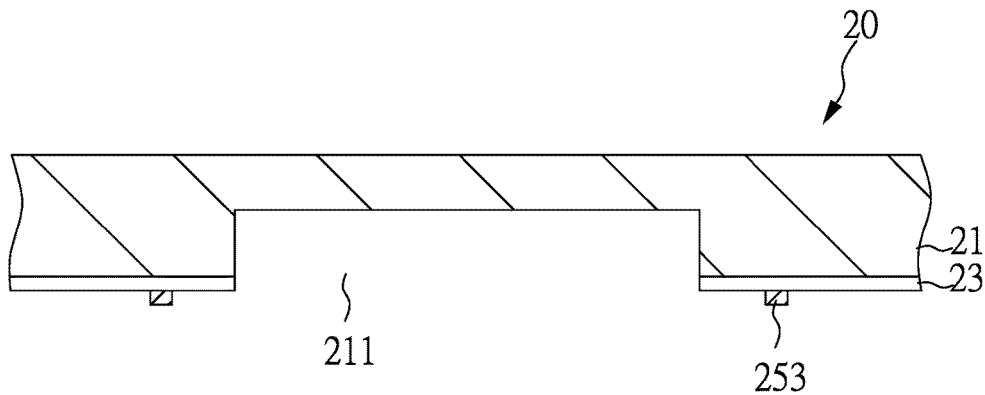
FIG. 41 is a cross-sectional view showing that the laminate substrate of FIG. 38 is provided with a cavity to finish the fabrication of a heat spreader in accordance with the third embodiment of the present invention.

FIG. 41 is a cross-sectional view of the heat spreader 20 with a cavity 211. The cavity 211 is formed in the structure of FIG. 38 and extends through the dielectric layer 23 and further extends into the metal plate 21.

Figure 42:
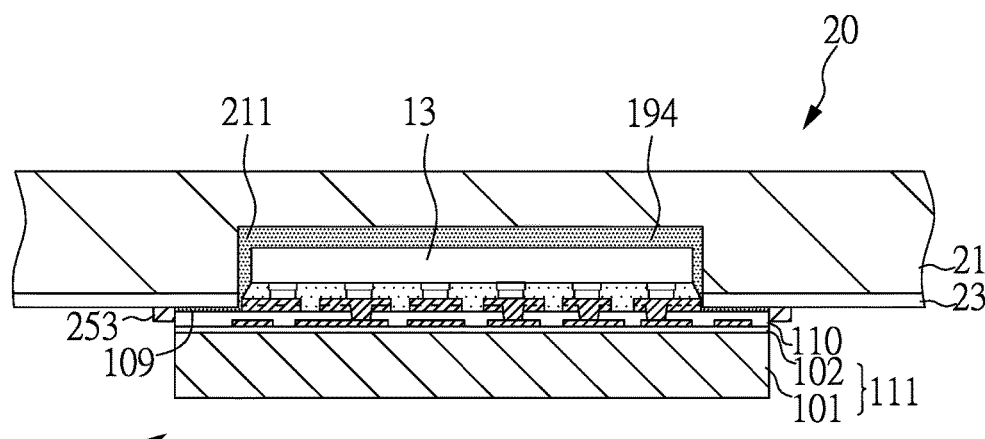
FIG. 42 is a cross-sectional view showing that a semiconductor subassembly is attached to the heat spreader of FIG. 41 in accordance with the third embodiment of the present invention.

FIG. 42 is a cross-sectional view of the structure with a semiconductor subassembly 10 attached to the heat spreader 20 using an adhesive 194. The semiconductor subassembly 10 is similar to that illustrated in FIG. 30, except that a plastic sheet and a release layer are respectively used as the support sheet 101 and the barrier layer 102 of the sacrificial carrier 111 and a single semiconductor device 13 is flip mounted on the first build-up circuitry 110 in this illustration. The semiconductor device 13 is positioned within the cavity 211, and the first build-up circuitry 110 and the sacrificial carrier 111 extend into an area outside of the cavity 211 with the second surface 109 of the first build-up circuitry 110 attached on the dielectric layer 23 of the heat spreader 20. The semiconductor device 13 is attached to the heat spreader 20 by dispensing the adhesive 194 on the cavity bottoms, and then inserting the semiconductor device 13 of the semiconductor subassembly 10 into the cavity 211. The adhesive 194 (typically a thermally conductive but electrically insulating adhesive) within the cavity 211 is compressed by the semiconductor device 13, flows downward into the gaps between the semiconductor device 13 and the cavity sidewalls, and overflows onto the flat surface of the dielectric layer 23. As a result, the adhesive 194 surrounds the embedded semiconductor device 13, and the squeezed out portion provides mechanical bonds between the first build-up circuitry 110 and the heat spreader 20. The registration mark 253 extends from the dielectric layer 23 and extends beyond the second surface 109 of the first build-up circuitry 110 in the downward direction and is in close proximity to the peripheral edges of the first build-up circuitry 110 to provide critical placement accuracy for the semiconductor subassembly 10.

Figure 43:
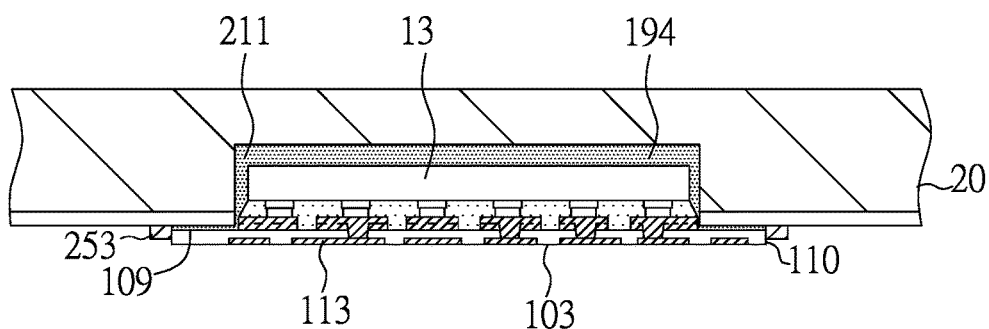
FIG. 43 is a cross-sectional view showing that the sacrificial carrier is removed from the structure of FIG. 42 in accordance with the third embodiment of the present invention.

FIG. 43 is a cross-sectional view of the structure after removal of the sacrificial carrier 111. In this embodiment, the barrier layer 102 is removed together with the support sheet 101 by mechanical peeling.

Figure 44:
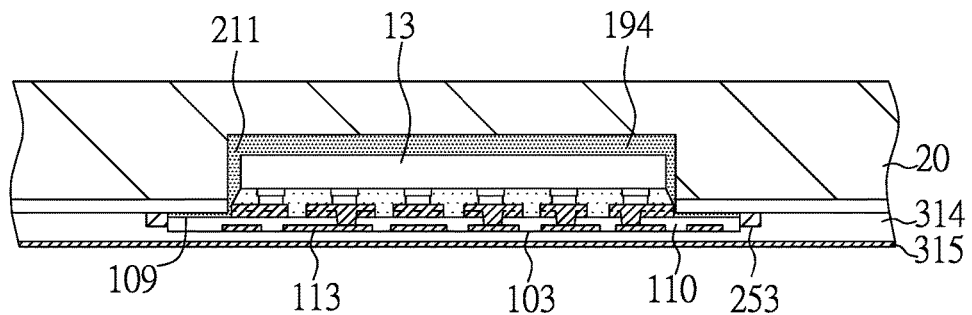
FIG. 44 is a cross-sectional view showing that a second insulating layer and a second metal sheet are disposed on the structure of FIG. 43 in accordance with the third embodiment of the present invention.

FIG. 44 is a cross-sectional view of the structure with a second insulating layer 314 and a second metal sheet 315 laminated/coated on the first build-up circuitry 110 and the heat spreader 20. The second insulating layer 314 extends laterally on the first build-up circuitry 110 and the heat spreader 20 and contacts and provides robust mechanical bonds between the second metal sheet 315 and the first build-up circuitry 110 and between the second metal sheet 315 and the heat spreader 20.

Figure 45:
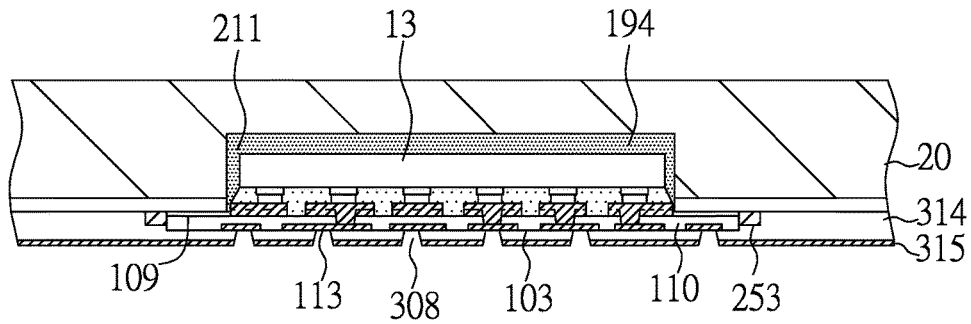
FIG. 45 is a cross-sectional view showing that the structure of FIG. 44 is provided with second via openings in accordance with the third embodiment of the present invention.

FIG. 45 is a cross-sectional view of the structure provided with second via openings 308. The second via openings 308 extend through the second metal sheet 315 and the second insulating layer 314 and are aligned with the first contact pads 113 of the first build-up circuitry 110.

Figure 46:
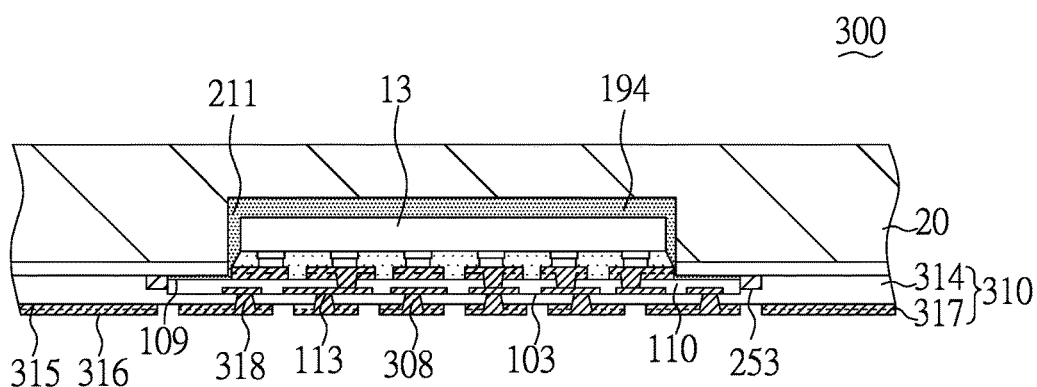
FIG. 46 is a cross-sectional view showing that the structure of FIG. 45 is provided with second conductive traces to finish the fabrication of a semiconductor assembly in accordance with the third embodiment of the present invention.

Referring now to FIG. 46, second conductive traces 317 are formed on the second insulating layer 314 by depositing a second plated layer 316 on the second metal sheet 315 and into the second via openings 308 and then patterning the second metal sheet 315 as well as the second plated layer 316 thereon. The second conductive traces 317 extend from the first contact pads 113 in the downward direction, fill up the second via openings 308 to form second conductive vias 318, and extend laterally on the second insulating layer 314.

Accordingly, as shown in FIG. 46, a semiconductor assembly 300 is accomplished and includes a semiconductor device 13, a heat spreader 20, a first build-up circuitry 110 and a second build-up circuitry 310. The semiconductor device 13 is electrically coupled to the pre-fabricated first build-up circuitry 110 by flip chip process and is enclosed in a cavity 211 of the heat spreader 20. The heat spreader 20 includes a registration mark 253 that extends beyond the second surface 109 of the first build-up circuitry 110 in the downward direction and is in close proximity to the peripheral edges of the first build-up circuitry 110 to provide critical placement accuracy for the first build-up circuitry 110. The second build-up circuitry 310 is electrically coupled to the first build-up circuitry 110 through the second conductive vias 318 and includes second conductive traces 317 laterally extending beyond peripheral edges of the first build-up circuitry 310 to provide fan-out routing/interconnection.

Embodiment 4

FIGS. 47-53 are cross-sectional views showing a method of making yet another semiconductor assembly in which the heat spreader has a registration mark within its cavity in accordance with yet another embodiment of the present invention.

For purposes of brevity, any description in aforementioned Embodiments above is incorporated herein insofar as the same is applicable, and the same description need not be repeated.

Figure 47:
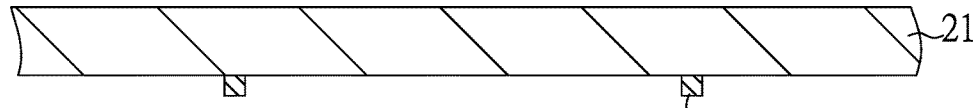
FIG. 47 is a cross-sectional view showing a metal plate with a registration mark thereon in accordance with the fourth embodiment of the present invention.

FIG. 47 is a cross-sectional view of the structure with a registration mark 213 formed on a metal plate 21. The metal plate 21 in this embodiment is a copper sheet with a thickness of 1 mm. The registration mark 213 can be formed by removing selected portions of the metal plate 21 or by pattern deposition of a metal or plastic material on the metal plate 21. In this embodiment, the registration mark 213 consists of plural metal posts in a rectangular frame arrangement conforming to four sides of a subsequently disposed semiconductor device. However, the registration mark patterns are not limited thereto and can be other various patterns against undesirable movement of the subsequently disposed semiconductor device.

Figure 48:
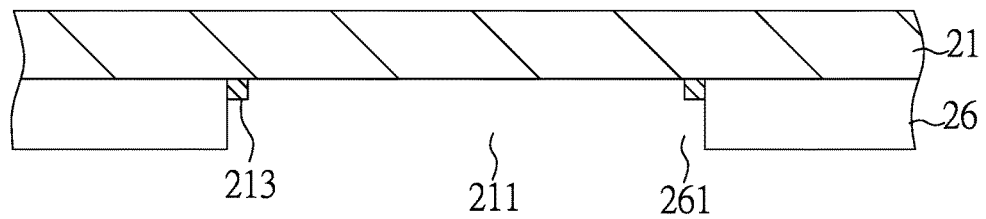
FIG. 48 is a cross-sectional view showing that a base layer is disposed on the metal plate of FIG. 47 to finish the fabrication of a heat spreader in accordance with the fourth embodiment of the present invention.

FIG. 48 is a cross-sectional view of a heat spreader 20 with the registration mark 213 inserted into an aperture 261 of a base layer 26. The base layer 26 is laminated onto the metal plate 21 with the registration mark 213 aligned with and inserted into the aperture 261 of the base layer 26. The base layer 26 can be made of epoxy, BT, polyimide and other kinds of resin or resin/glass composite. In this embodiment, the base layer 26 has a thickness of 0.21 mm to match 0.15 mm chip and 0.05 mm bump. As a result, the heat spreader 20 has a cavity 211 corresponding to the aperture 261 of the base layer 26, and the registration mark 213 is located on the bottom of the cavity 211.

Figure 49:
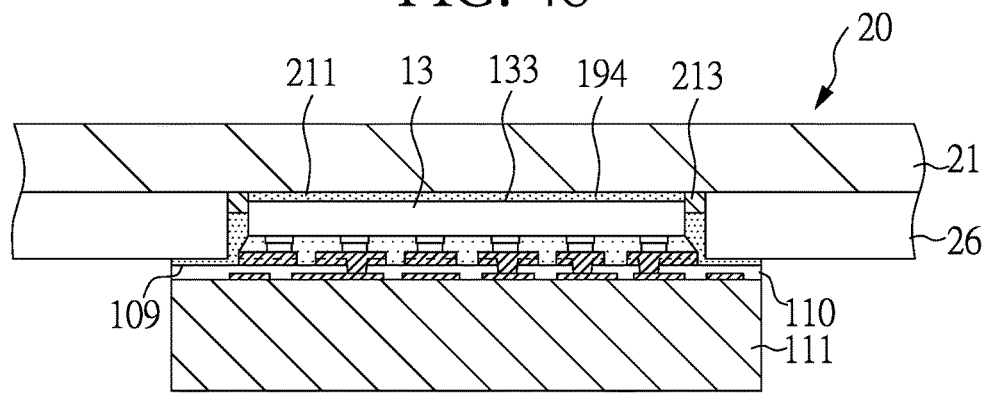
FIG. 49 is a cross-sectional view showing that a semiconductor subassembly is attached to the heat spreader of FIG. 48 in accordance with the fourth embodiment of the present invention.

FIG. 49 is a cross-sectional view of the structure with a semiconductor subassembly 10 attached on the heat spreader 20 using an adhesive 194. The semiconductor subassembly 10 is similar to that illustrated in FIG. 11, except that the sacrificial carrier 111 is made of silicon and a single semiconductor device 13 is flip mounted on the first build-up circuitry 110 in this illustration. The semiconductor subassembly 10 is attached to the heat spreader 20 with the semiconductor device 13 inserted into the cavity 211 and the registration mark 213 laterally aligned with peripheral edges of the semiconductor device 13. The adhesive 194 surrounds the embedded semiconductor device 13, and the squeezed out portion contacts and is sandwiched between the second surface 109 of the first build-up circuitry 110 and the base layer 26. The registration mark 213 extends from the bottom of the cavity 211 and extends beyond the inactive surface 133 of the semiconductor device 13 in the downward direction and is in close proximity to the peripheral edges of the semiconductor device 13 to provide critical placement accuracy for the semiconductor subassembly 10.

Figure 50:
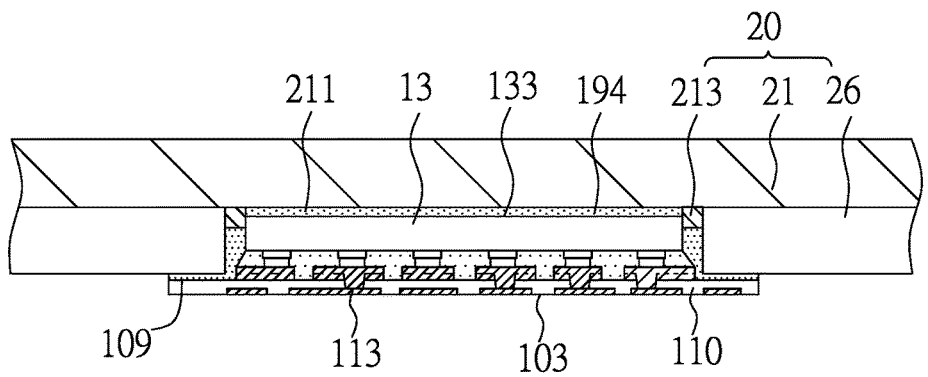
FIG. 50 is a cross-sectional view showing that the sacrificial carrier is removed from the structure of FIG. 49 in accordance with the fourth embodiment of the present invention.

FIG. 50 is a cross-sectional view of the structure after removal of the sacrificial carrier 111. In this embodiment, the sacrificial carrier 111 can be removed to expose the first contact pads 113 of the first build-up circuitry 110 from below.

Figure 51:
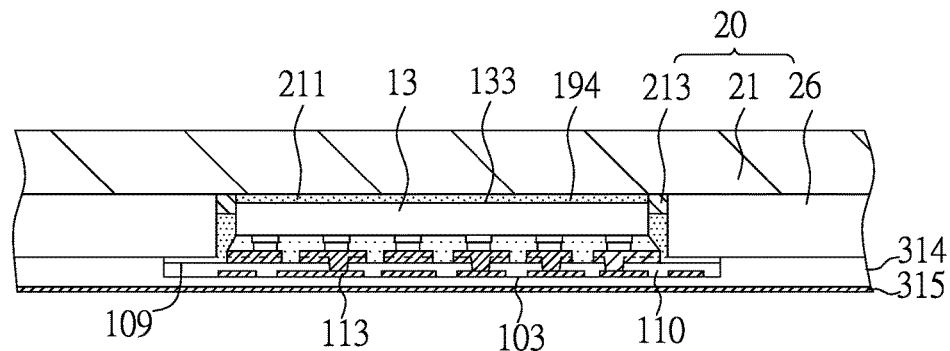
FIG. 51 is a cross-sectional view showing that a second insulating layer and a second metal sheet are disposed on the structure of FIG. 50 in accordance with the fourth embodiment of the present invention.

FIG. 51 is a cross-sectional view of the structure with a second insulating layer 314 and a second metal sheet 315 laminated/coated on the first build-up circuitry 110 and the heat spreader 20. The second insulating layer 314 contacts and provides robust mechanical bonds between the second metal sheet 315 and the first build-up circuitry 110 and between the second metal sheet 315 and the base layer 26.

Figure 52:
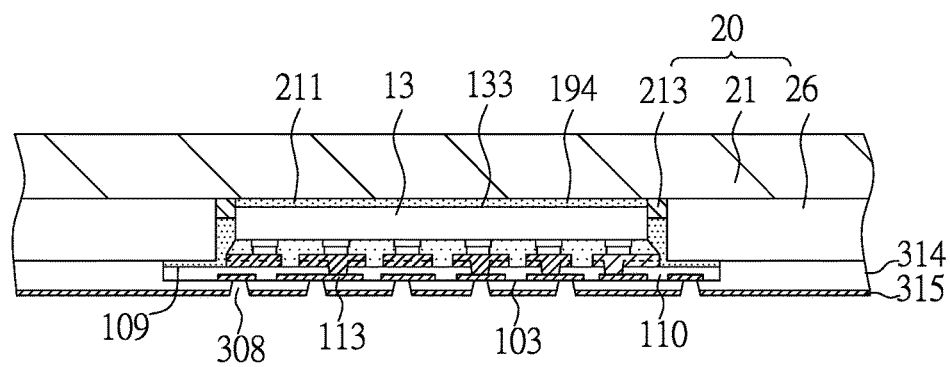
FIG. 52 is a cross-sectional view showing that the structure of FIG. 51 is provided with second via openings in accordance with the fourth embodiment of the present invention.

FIG. 52 is a cross-sectional view of the structure provided with second via openings 308. The second via openings 308 extend through the second metal sheet 315 and the second insulating layer 314 and are aligned with the first contact pads 113 of the first build-up circuitry 110.

Figure 53:
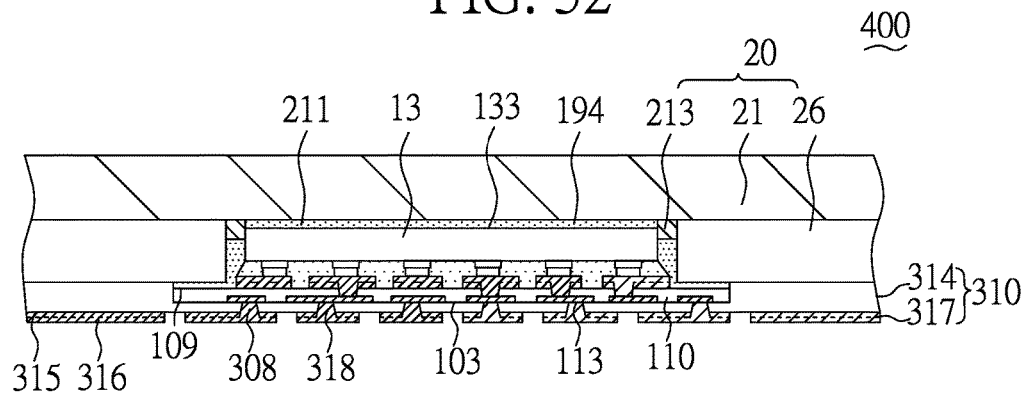
FIG. 53 is a cross-sectional view showing that the structure of FIG. 52 is provided with second conductive traces to finish the fabrication of a semiconductor assembly in accordance with the fourth embodiment of the present invention.

Referring now to FIG. 53, second conductive traces 317 are formed on the second insulating layer 314 by depositing a second plated layer 316 on the second metal sheet 315 and into the second via openings 308 and then patterning the second metal sheet 315 as well as the second plated layer 316 thereon. The second conductive traces 317 extend from the first contact pads 113 in the downward direction, fill up the second via openings 308 to form second conductive vias 318, and extend laterally on the second insulating layer 314.

Accordingly, as shown in FIG. 53, a semiconductor assembly 400 is accomplished and includes a semiconductor device 13, a heat spreader 20, a first build-up circuitry 110 and a second build-up circuitry 310. The semiconductor device 13 is electrically coupled to the pre-fabricated first build-up circuitry 110 by flip chip process and is enclosed in a cavity 211 of the heat spreader 20 with a registration mark 213 laterally aligned with and in close proximity to the peripheral edges of the semiconductor device 13. The registration mark 213 of the heat spreader 20 extends from the bottom of the cavity 211 and extends beyond the inactive surface 133 of the semiconductor device 13 in the downward direction. The second build-up circuitry 310 is electrically coupled to the first build-up circuitry 110 through the second conductive vias 318 to provide fan-out routing/interconnection.

The assemblies described above are merely exemplary. Numerous other embodiments are contemplated. In addition, the embodiments described above can be mixed-and-matched with one another and with other embodiments depending on design and reliability considerations. The semiconductor device can share or not share the cavity with other semiconductor devices. For instance, a cavity can accommodate a single semiconductor device, and the heat spreader can include multiple cavities arranged in an array for multiple semiconductor devices. Alternatively, numerous semiconductor devices can be positioned within a single cavity. Likewise, a semiconductor device can share or not share the first build-up circuitry with other semiconductor devices. For instance, a single semiconductor device can be electrically connected to the first build-up circuitry. Alternatively, numerous semiconductor devices may be coupled to the first build-up circuitry. For instance, four small semiconductor devices in a 2×2 array can be coupled to the first build-up circuitry, and the first build-up circuitry can include additional contact pads to receive and route I/O pads of additional semiconductor devices. Also, the second build-up circuitry can include additional conductive traces to accommodate additional contact pads of the first build-up circuitry.

As illustrated in the aforementioned embodiments, a distinctive semiconductor assembly is configured to exhibit improved thermal performance and reliability and includes a semiconductor device, a heat spreader, a first build-up circuitry and a second build-up circuitry, wherein (i) the semiconductor device is electrically coupled to the first build-up circuitry by a plurality of bumps and enclosed in a cavity of the heat spreader; (ii) the first build-up circuitry laterally extends beyond the cavity of the heat spreader and includes at least one conductive traces laterally extending beyond peripheral edges of the semiconductor device; and (iii) the second build-up circuitry is formed over the heat spreader and the first build-up circuitry and electrically coupled to the first build-up circuitry and includes at least one conductive traces laterally extending beyond peripheral edges of the first build-up circuitry.

The first build-up circuitry can be first detachably adhered over a sacrificial carrier, followed by electrically coupling the semiconductor device to the first build-up circuitry to form a semiconductor subassembly. Accordingly, the semiconductor device can be embedded in the cavity of the heat spreader by the attachment of the semiconductor subassembly to the heat spreader with the sacrificial carrier and the first build-up circuitry laterally extending beyond the cavity. In the present invention, the first build-up circuitry can be directly formed over the sacrificial carrier, or be separately formed and then detachably adhered to the sacrificial carrier. Specifically, the first build-up circuitry can be formed to include first contact pads over the sacrificial carrier, an insulating layer over the first contact pads and the sacrificial carrier, and conductive traces that fill up via openings in the insulating layer to form conductive vias and laterally extend on the insulating layer. Further, the first build-up circuitry may include additional insulating layers, additional via openings, and additional conductive traces if needed for further signal routing, and the outmost conductive traces away from the sacrificial carrier can include second contact pads to provide electrical contacts for the next build-up circuitry. As a result, the first build-up circuitry can be a multi-layered routing circuitry, and have first contact pads at its first surface and second contact pads at its opposite second surface that can be electrically coupled to the first contact pads by conductive vias or inner conductive trace. For the convenience of below description, the direction in which the first surface of the first build-up circuitry faces is defined as the first direction, and the direction in which the second surface of the first build-up circuitry faces is defined as the second direction. The surfaces, facing in the first direction, of the first contact pads and the innermost insulating layer adjacent to the sacrificial carrier can be substantially coplanar with each other. In a preferred embodiment, the first build-up circuitry has a pattern of traces that fan out from a finer pitch at the second contact pads to a coarser pitch at the first contact pads, and provides first level fan-out routing/interconnection for the semiconductor device assembled thereon. Specifically, the first contact pads can have a larger pad pitch than that of the second bond pads, whereas the second contact pads can be formed to match I/O pads of the semiconductor device. Accordingly, I/O pads of the semiconductor device can be electrically coupled to the first build-up circuitry from the first surface of the first build-up circuitry through a plurality of bumps in contact with the second contact pads.

The sacrificial carrier serves as the rigidity support for the first build-up circuitry and can be detached from the first build-up circuitry by a chemical etching process or a mechanical peeling process after the attachment of the semiconductor subassembly to the heat spreader. The sacrificial carrier can have a thickness of 0.1 mm to 10 mm and may be made of any conductive or non-conductive material, such as copper, nickel, aluminum, chromium, tin, iron, stainless steel, 'silicon, glass, graphite, plastic film, or other metals, alloys or non-metallic materials. For the aspect of detaching the sacrificial carrier by a chemical etching process, the sacrificial carrier typically is made of chemically removable materials. In consideration of the first contact pads in contact with the sacrificial carrier not being etched during removal of the sacrificial carrier, the sacrificial carrier may be made of a material such as nickel, chromium, tin, iron, stainless steel, or any other material that can be removed using an etching solution inactive to the first bond pads made of copper. Alternatively, the first contact pads are made of any stable material against etching during removal of the sacrificial carrier. For instance, the first contact pads may be gold pads in the case of the sacrificial carrier being made of copper. Additionally, the sacrificial carrier also can be a multi-layer structure having a barrier layer and a support sheet, and the first build-up circuitry is formed over the barrier layer of the sacrificial carrier. As the first build-up circuitry is spaced from the support sheet by a barrier layer disposed therebetween, the support sheet can be removed without damage on the first contact pads of the first build-up circuitry even the first contact pads and the support sheet are made of the same material. The barrier layer may be a metal layer that is inactive against chemical etching during chemically removing the support sheet and can be removed using an etching solution inactive to the first contact pads. For instance, the support sheet made of copper or aluminum may be provided with a nickel, chromium or titanium layer as the barrier layer on its surface, and the first contact pads made of copper or aluminum are deposited on the nickel, chromium or titanium layer. Accordingly, the nickel, chromium or titanium layer can protect the first contact pads from etching during removal of the support sheet. As an alternative, the barrier layer may be a dielectric layer that can be removed by, for example, a mechanical peeling or plasma ashing process. For instance, a release layer may be used as a barrier layer disposed between the support sheet and the first build-up circuitry, and the support sheet can be removed together with the release layer by a mechanical peeling process. Additionally, the first build-up circuitry may be spaced from the sacrificial carrier by an interlayer dielectric disposed therebetween, and the interlayer dielectric can remain bonded to the first build-up circuitry after the removal of the sacrificial carrier and becomes a portion of the subsequent second build-up circuitry.

The heat spreader can extend to the peripheral edges of the semiconductor assembly to provide mechanical support for the semiconductor device, the first build-up circuitry and the second build-up circuitry. In a preferred embodiment, the heat spreader includes a metal plate to provide essential thermal dissipation and electromagnetic shielding for the embedded semiconductor device. The metal plate can have a thickness of 0.1 mm to 10 mm. The material of the metal plate can be selected for the thermal dissipation consideration, and include copper, aluminum, stainless steel or their alloys. Further, the heat spreader can be a single-layer structure or multi-layer structure, and includes a cavity extending into the metal plate or defined by an aperture of a base layer on the metal plate. The base layer can be made of epoxy, BT, polyimide and other kinds of resin or resin/glass composite. As such, the heat from the semiconductor device can be dissipated through the metal plate that provides a thermal contact surface at the cavity bottom. For the heat spreader with the cavity formed in the metal plate, the metallic sidewalls of the cavity also can serve as additional thermal contact surface for the semiconductor device in addition to the metallic bottom of the cavity.

Moreover, the heat spreader may further include a registration mark outside or within the cavity for the subassembly attachment. Accordingly, the placement accuracy of the semiconductor subassembly can be provided by the registration mark positioned around the second surface of the first build-up circuitry or the inactive surface of the embedded semiconductor device. For the aspect of the registration mark positioned outside the cavity of the heat spreader, the registration mark extends from a flat surface of the heat spreader adjacent to the cavity entrance and extends beyond the second surface of the first build-up circuitry in the first direction. As for another aspect of the registration mark positioned within the cavity of the heat spreader, the registration mark extends from the cavity bottom and extends beyond the inactive surface of the semiconductor device in the first direction. As such, the subassembly placement accuracy can be provided by the registration mark that is laterally aligned with and in close proximity to the peripheral edges of the first build-up circuitry or the semiconductor device.

The heat spreader having a registration mark around the cavity entrance can be fabricated by the steps of: providing a metal plate; forming a cavity in the metal plate; and forming a registration mark around the entrance of the cavity by removing a selected portion of the metal plate or by pattern deposition of a metal or a plastic material on the metal plate to form the registration mark. Accordingly, the heat spreader is a metal plate having a cavity formed therein and has a registration mark extends from a flat surface of the heat spreader adjacent to the cavity entrance. Also, the heat spreader having a registration mark outside the cavity may be fabricated from a laminate substrate by the steps of: providing a laminate substrate that includes a dielectric layer and a metal plate; forming a registration mark on the dielectric layer by removing a selected portion of a metal layer on the dielectric layer or by pattern deposition of a metal or a plastic material on the dielectric layer to form the registration mark; and forming a cavity that extends through the dielectric layer and extends into the metal plate. As a result, the heat spreader includes a metal plate, a dielectric layer, and a registration mark that extends from the dielectric layer of the heat spreader and is positioned around the cavity entrance. For the aspect of the registration mark positioned within the cavity of the heat spreader, it can be achieved by the steps of: providing a metal plate; forming the registration mark at a surface of the metal plate by removing a selected portion of the metal plate or by pattern deposition of a metal or a plastic material on the metal plate; and providing a base layer on the metal plate with the registration mark located within an aperture of the base layer. As such, the heat spreader includes a metal plate, a base layer, and a registration mark extends from the metal plate at its cavity bottom.

The registration mark can be made of a metal, a photosensitive plastic material or non-photosensitive material. For instance, the registration mark can consist essentially of copper, aluminum, nickel, iron, tin or their alloys. The registration mark can also include or consist of epoxy or polyimide. Further, the registration mark can have patterns against undesirable movement of the semiconductor subassembly. For instance, the registration mark can include a continuous or discontinuous strip or an array of posts. Alternatively, the registration mark may laterally extend to the peripheral edges of the heat spreader and have inner peripheral edges that conform to the peripheral edges of the first build-up circuitry. Specifically, the registration mark can be laterally aligned with four lateral surfaces of the first build-up circuitry or the embedded semiconductor device to define an area with the same or similar topography as the first build-up circuitry or the embedded semiconductor device and prevent the lateral displacement of the semiconductor subassembly. For instance, the registration mark can be aligned along and conform to four sides, two diagonal corners or four corners of the first build-up circuitry or the embedded semiconductor device, and the gaps in between the first build-up circuitry and the registration mark or between the embedded semiconductor device and the registration mark preferably is in a range of about 5 to 50 microns. As a result, the registration mark located beyond the first build-up circuitry or the embedded semiconductor device can provide placement accuracy for the semiconductor subassembly. Besides, the registration mark preferably has a height in a range of 5-200 microns.

The cavity of the heat spreader can have a larger diameter or dimension at its entrance than at its bottom and a depth of 0.05 mm to 0.9 mm. For instance, the cavity can have a cut-off conical or pyramidal shape in which its diameter or dimension increases as it extends in the first direction from its bottom to its entrance. Alternatively, the cavity can have a cylindrical shape with a constant diameter. The cavity can also have a circular, square or rectangular periphery at its entrance and its bottom. The adhesive can be dispensed on the cavity bottom and then be squeezed partially out of the cavity when inserting the semiconductor device into the cavity. Accordingly, the adhesive can contact and surround the embedded semiconductor device within the cavity of the heat spreader, and the squeezed out portion can contact and be sandwiched between the second surface of the first build-up circuitry and the flat surface of the heat spreader that laterally extends from the cavity entrance. Alternatively, a first adhesive (typically a thermally conductive adhesive) can be dispensed on the cavity bottom and be contained within the cavity when inserting the semiconductor device into the cavity. A second adhesive (typically an electrically insulating underfill) can then be dispensed and filled into the remaining space within the cavity and extends to the space between the second surface of the first build-up circuitry and the flat surface of the heat spreader that laterally extends from the cavity entrance. Accordingly, the first adhesive provides mechanical bonds and thermal connection between the semiconductor device and the heat spreader while the second adhesive provides mechanical bonds between the first build-up circuitry and the heat spreader.

The second build-up circuitry is disposed adjacent to the first surface of the first build-up circuitry and can provide secondary fan-out routing/interconnection. Besides, the second build-up circuitry can further be electrically and thermally coupled to the metallic surface of the heat spreader by additional conductive vias for ground connection. In a preferred embodiment, the second build-up circuitry includes an insulating layer and one or more conductive traces. The insulating layer is deposited over the first surface of the first build-up circuitry and contacts the heat spreader and laterally covers sidewalls of the first build-up circuitry. The conductive traces extend laterally on the insulating layer and extend through via openings in the insulating layer to form conductive vias in direct contact with the first contact pads of the first build-up circuitry and optionally with the heat spreader. Accordingly, the conductive traces can directly contact the first contact pads to provide signal routing for the first build-up circuitry, and thus the electrical connection between the first build-up circuitry and the second build-up circuitry can be devoid of soldering material. Also, the interface between the heat spreader and the second build-up circuitry can be devoid of adhesive.

The second build-up circuitry can further include additional insulating layers, additional via openings, and additional conductive traces if needed for further signal routing. The outmost conductive traces of the second build-up circuitry can accommodate conductive joints, such as solder balls, for electrical communication and mechanical attachment with the next level assembly or another electronic device such as a semiconductor chip, a plastic package or another semiconductor device.

The semiconductor device can be a packaged or unpackaged chip. For instance, the semiconductor device can be a bare chip, or a wafer level packaged die, etc.

The term "cover" refers to incomplete or complete coverage in a vertical and/or lateral direction. For instance, in the cavity-down position, the metal plate covers the chip in the upward direction regardless of whether another element such as the adhesive is between the metal plate and the semiconductor device.

The phrase "aligned with" refers to relative position between elements regardless of whether elements are spaced from or adjacent to one another or one element is inserted into and extends into the other element. For instance, the registration mark is laterally aligned with the first build-up circuitry since an imaginary horizontal line intersects the registration mark and the first build-up circuitry, regardless of whether another element is between the registration mark and the first build-up circuitry and is intersected by the line, and regardless of whether another imaginary horizontal line intersects the first build-up circuitry but not the registration mark or intersects the registration mark but not the first build-up circuitry. Likewise, the via openings are aligned with the first contact pads of the first build-up circuitry.

The phrases "adhered to", "adhered over", "mounted on", "attached on", "attached to", "laminated on" and "laminated onto" include contact and non-contact with a single or multiple element(s). For instance, the first build-up circuitry is detachably adhered over the sacrificial carrier regardless of whether it contacts the sacrificial carrier or is separated from the sacrificial carrier by an interlayer dielectric.

The phrase "in close proximity to" refers to a gap between elements not being wider than a maximum acceptable limit. As known in the art, when the gap between the registration mark and the first build-up circuitry or between the registration mark and the semiconductor device is not narrow enough, the location error of the semiconductor subassembly due to the lateral displacement of the semiconductor subassembly within the gap may exceed the maximum acceptable error limit. In some cases, once the location error of the semiconductor subassembly goes beyond the maximum limit, it is impossible to align the predetermined portion of the first build-up circuitry with a laser beam, resulting in the electrical connection failure between the first build-up circuitry and the second build-up circuitry. According to the pad size of the first build-up circuitry, those skilled in the art can ascertain the maximum acceptable limit for a gap between the first build-up circuitry and the registration mark or between the semiconductor device and the registration mark through trial and error to ensure the conductive vias being aligned with the first contact pads of the first build-up circuitry. Thereby, "the registration mark is in close proximity to the peripheral edges of the semiconductor device" and "the registration mark is in close proximity to the peripheral edges of the first build-up circuitry" mean that the gap between the registration mark and the peripheral edges of the semiconductor device or the first build-up circuitry is narrow enough to prevent the location error of the first build-up circuitry from exceeding the maximum acceptable error limit.

The phrases "electrical connection", "electrically connected", "electrically coupled" and "electrically coupling" refer to direct and indirect electrical connection. For instance, the conductive traces of the second build-up circuitry directly contact and are electrically connected to the first contact pads of the first build-up circuitry, and the conductive traces of the second build-up circuitry are spaced from and can be electrically connected to the second contact pads of the first build-up circuitry by the first contact pads and the conductive vias of the first build-up circuitry.

The "first direction" and "second direction" do not depend on the orientation of the assembly, as will be readily apparent to those skilled in the art. For instance, the first surface of the first build-up circuitry faces the first direction and the second surface of the first build-up circuitry faces the second direction regardless of whether the assembly is inverted. Likewise, the registration mark is "laterally" aligned with the first build-up circuitry in a lateral plane regardless of whether the assembly is inverted, rotated or slanted. Thus, the first and second directions are opposite one another and orthogonal to the lateral directions. Furthermore, the first direction is the upward direction and the second direction is the downward direction in the cavity-up position, and the first direction is the downward direction and the second direction is the upward direction in the cavity-down position.

The semiconductor assembly according to the present invention has numerous advantages. For instance, the semiconductor device is electrically coupled to the first build-up circuitry by a well-known flip chip bonding process such as thermo-compression or solder reflow, which can avoid the positional accuracy issue inherent in most conventional approaches where an adhesive carrier is used for temporary bonding. The first build-up circuitry can be designed to provide a first level fan-out routing/interconnection for the embedded semiconductor device, whereas the second build-up circuitry provides a second level fan-out routing/interconnection. As the second build-up circuitry is formed on the first build-up circuitry designed with larger pad size and pitch space, the manufacturing yield is greatly improved compared to the conventional types where second build-up circuitry is directly formed on the chip I/O pad without fan-out routing. The registration mark can provide critical placement accuracy for the first build-up circuitry. As such, the shape or depth of the cavity that houses the embedded semiconductor device is not a critical parameter that needs to be tightly controlled. The heat spreader can provide thermal dissipation, electromagnetic shielding and moisture barrier for the embedded semiconductor device, and also provides mechanical support for the semiconductor device, the first build-up circuitry and the second build-up circuitry. The direct electrical connection without solder between the first build-up circuitry and the second build-up circuitry is advantageous to high I/O and high performance. The assembly made by this method is reliable, inexpensive and well-suited for high volume manufacture.

The manufacturing process is highly versatile and permits a wide variety of mature electrical and mechanical connection technologies to be used in a unique and improved manner. The manufacturing process can also be performed without expensive tooling. As a result, the manufacturing process significantly enhances throughput, yield, performance and cost effectiveness compared to conventional techniques.

The embodiments described herein are exemplary and may simplify or omit elements or steps well-known to those skilled in the art to prevent obscuring the present invention. Likewise, the drawings may omit duplicative or unnecessary elements and reference labels to improve clarity.

What is claimed is:

1. A method of making a thermally enhanced semiconductor assembly, comprising steps of:
    providing a heat spreader with a cavity;
    providing a semiconductor subassembly that includes:
        providing a semiconductor device;
        providing a first build-up circuitry detachably adhered over a sacrificial carrier; and
        electrically coupling the semiconductor device to the first build-up circuitry by a plurality of bumps;
    attaching the semiconductor subassembly to the heat spreader using an adhesive with the semiconductor device inserted into the cavity and the first build-up circuitry laterally extending beyond the cavity;
    detaching the sacrificial carrier from the first build-up circuitry; and
    forming a second build-up circuitry over the heat spreader and the first build-up circuitry, wherein the second build-up circuitry is electrically coupled to the first build-up circuitry through conductive vias.

2. The method of claim 1, wherein the step of electrically coupling the semiconductor device to the first build-up circuitry is performed on a panel scale, and a singulation step is executed to separate individual semiconductor subassemblies before the step of attaching the semiconductor subassembly to the heat spreader.

3. The method of claim 1, wherein the first build-up circuitry includes first and second contact pads at opposite first and second surfaces thereof respectively, wherein the first contact pads are electrically coupled with the conductive vias and the second contact pads are connected to the plurality of bumps and have a smaller pad pitch than that of the first contact pads.

4. The method of claim 1, wherein the heat spreader further includes a registration mark outside the cavity, and the semiconductor subassembly is attached to the heat spreader with the registration mark laterally aligned with and in close proximity to peripheral edges of the first build-up circuitry.

5. The method of claim 4, wherein the step of providing the heat spreader includes:
    providing a metal plate;
    forming the cavity in the metal plate; and
    forming the registration mark around the cavity by removing a selected portion of the metal plate or by pattern deposition of a metal or a plastic material on the metal plate.

6. The method of claim 4, wherein the step of providing the heat spreader includes:

providing a laminated substrate that includes a dielectric layer and a metal plate;

forming the registration mark on the dielectric layer by removing a selected portion of a metal layer on the dielectric layer or by pattern deposition of a metal or a plastic material on the dielectric layer; and forming the cavity that extends through the dielectric layer and optionally extends into the metal plate.

7. The method of claim 1, wherein the heat spreader further includes a registration mark within the cavity, and the semiconductor subassembly is attached to the heat spreader with the registration mark laterally aligned with and in close proximity to peripheral edges of the semiconductor device.

8. The method of claim 7, wherein the step of providing the heat spreader includes:

providing a metal plate;

forming the registration mark at a surface of the metal plate by removing a selected portion of the metal plate or by pattern deposition of a metal or a plastic material on the metal plate; and providing a base layer on the metal plate with the registration mark located within an aperture of the base layer.

9. The method of claim 1, wherein the step of detaching the sacrificial carrier from the first build-up circuitry includes a chemical etching process or a mechanical peeling process.

10. The method of claim 1, wherein the second build-up circuitry comprises additional conductive vias electrically coupled to and thermally conductible to the heat spreader.

11. A thermally enhanced semiconductor assembly prepared by a method that comprises steps of:

providing a heat spreader with a cavity;

providing a semiconductor subassembly that includes:

providing a semiconductor device;

providing a first build-up circuitry detachably adhered over a sacrificial carrier; and electrically coupling the semiconductor device to the first build-up circuitry by a plurality of bumps;

attaching the semiconductor subassembly to the heat spreader using an adhesive with the semiconductor device inserted into the cavity and the first build-up circuitry laterally extending beyond the cavity;

detaching the sacrificial carrier from the first build-up circuitry; and forming a second build-up circuitry over the heat spreader and the first build-up circuitry, wherein the second build-up circuitry is electrically coupled to the first build-up circuitry through conductive vias.

* * * * *